(12) United States Patent
Cheng

(10) Patent No.: US 10,910,453 B2
(45) Date of Patent: Feb. 2, 2021

(54) DISPLAY DEVICE

(71) Applicant: Japan Display Inc., Tokyo (JP)

(72) Inventor: Hsiang-Yuan Cheng, Tokyo (JP)

(73) Assignee: Japan Display Inc., Tokyo (JP)

( * ) Notice: Subject to any disclaimer, the term of this patent is extended or adjusted under 35 U.S.C. 154(b) by 85 days.

(21) Appl. No.: 15/977,016

(22) Filed: May 11, 2018

(65) Prior Publication Data

US 2018/0342565 A1 Nov. 29, 2018

(30) Foreign Application Priority Data

May 24, 2017 (JP) .................................. 2017-102698

(51) Int. Cl.
| | |
|---|---|
| *H01L 27/32* | (2006.01) |
| *H01L 27/12* | (2006.01) |
| *H01L 51/56* | (2006.01) |
| *G09G 3/3225* | (2016.01) |
| *H01L 51/52* | (2006.01) |

(52) U.S. Cl.
CPC ....... *H01L 27/3246* (2013.01); *G09G 3/3225* (2013.01); *H01L 27/124* (2013.01); *H01L 27/1248* (2013.01); *H01L 27/3258* (2013.01); *H01L 51/5203* (2013.01); *H01L 51/56* (2013.01); *G02F 2201/123* (2013.01); *H01L 27/3276* (2013.01); *H01L 2251/5323* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 2007/0152577 A1* | 7/2007 | Cho | ........................ B32B 27/36 |
| | | | 313/511 |
| 2008/0142474 A1* | 6/2008 | Kim | .................. H01L 27/10852 |
| | | | 216/6 |

FOREIGN PATENT DOCUMENTS

JP 2007-183605 A 7/2007

* cited by examiner

*Primary Examiner* — Hrayr A Sayadian
(74) *Attorney, Agent, or Firm* — Michael Best & Friedrich LLP

(57) ABSTRACT

A display device includes a substrate including flexibility, a first inorganic insulating film having silicon and at least one of nitrogen and oxygen arranged above the substrate, a first groove part arranged so as to divide the first inorganic insulating film, a first silicon contained film filled into the first groove part, and a pixel electrode arranged to overlap a region surrounded by the first groove part. The first silicon contained film includes polysiloxane or polysilazane.

10 Claims, 22 Drawing Sheets

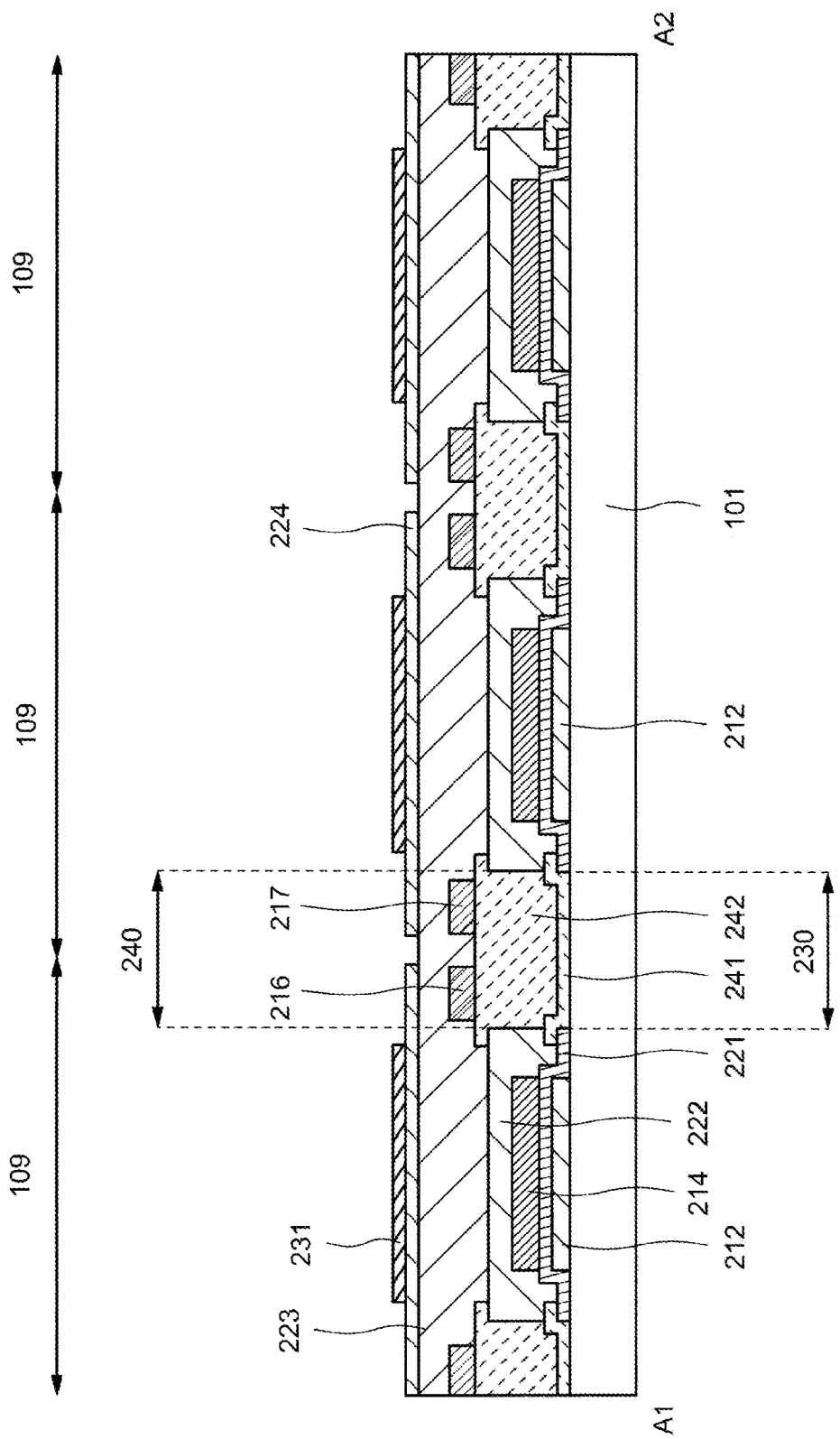

DISPLAY DEVICE

CROSS REFERENCE TO RELATED APPLICATIONS

This application is based upon and claims the benefit of priority from the prior Japanese Patent Application No. 2017-102698, filed on May 24, 2017, the entire contents of which are incorporated herein by reference.

FIELD

An embodiment of the present invention is related to a display device which can be bent.

BACKGROUND

Conventionally, as a display device, an organic EL display device (Organic Electroluminescence Display) using an organic electroluminescence material (organic EL material) as a light emitting element (organic EL element) of a display part has been known. Unlike a liquid crystal display device or the like, an organic EL display device is a so-called self-light emitting type display device which realizes display by causing an organic EL material to emit light.

In recent years, in such organic EL display devices, bendable display devices arranged with organic EL elements on flexible resin substrates such as plastic have been developed (for example, Japanese Laid Open Patent Publication No. 2007-183605).

SUMMARY

A display device in an embodiment according to the present invention has a substrate including flexibility, a first inorganic insulating film including silicon and at least one of nitrogen and oxygen arranged above the substrate, a first groove part arranged so as to divide the first inorganic insulating film, a first silicon contained film filled into the first groove part; and a pixel electrode arranged to overlap a region surrounded by the first groove part. The wherein the first silicon contained film includes polysiloxane or polysilazane.

BRIEF DESCRIPTION OF DRAWINGS

FIG. 4N is a cross-sectional view of a manufacturing method of a display device related to an embodiment of the present invention;

DESCRIPTION OF EMBODIMENTS

Figure 1:
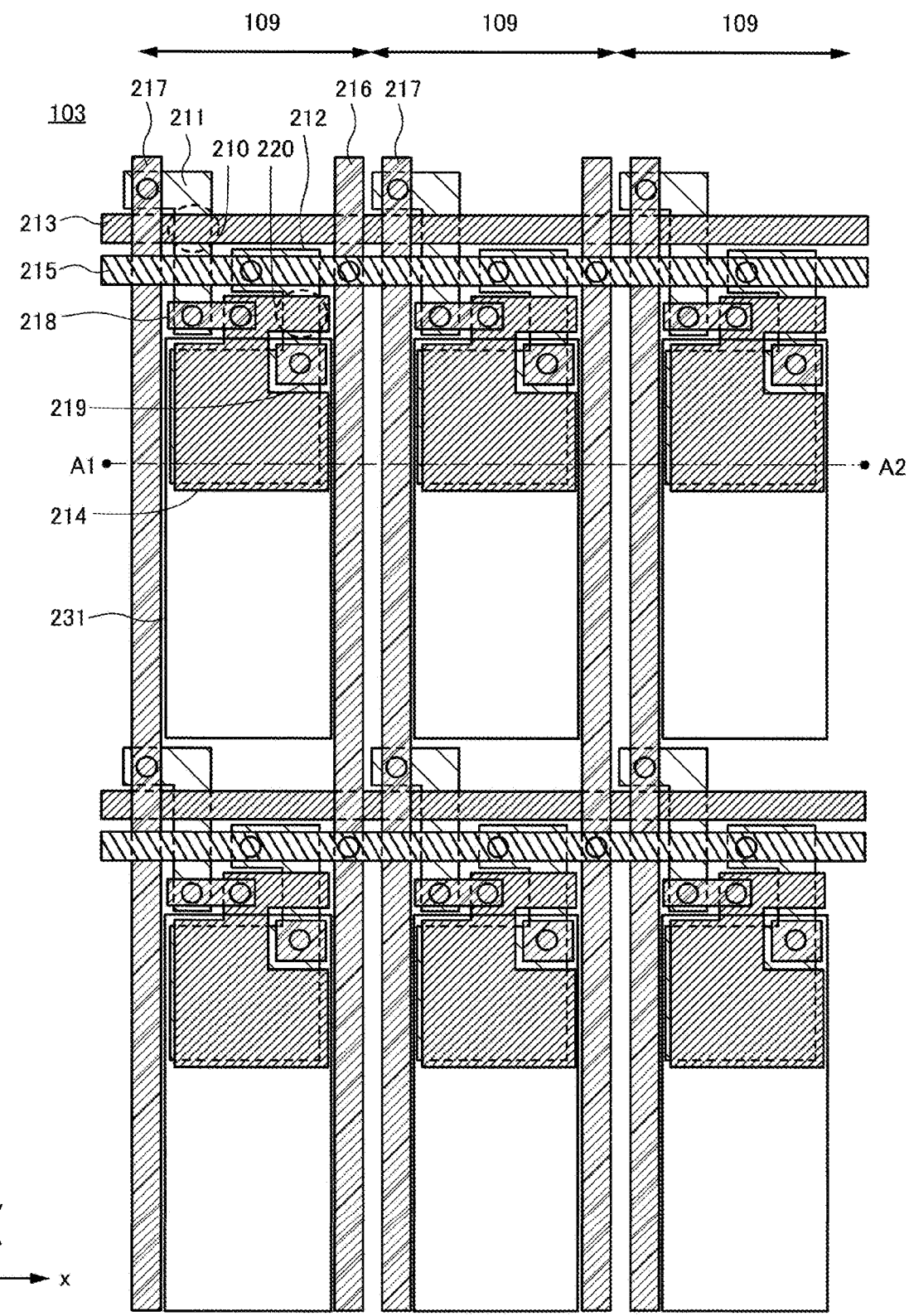
FIG. 1 is a planar view showing a pixel structure of a display device related to an embodiment of the present invention.

Each embodiment of the present invention is explained below while referring to the drawings and the like. However, the present invention can be performed in various modes without departing from the gist of the invention and it should not be interpreted as being limited to the description contents of the embodiments exemplified herein. In addition, in order to clarify the explanation more clearly in the drawings, the width, the thickness and the shape of each part may be schematically represented as compared with their actual form. However, these schematic diagrams are just an example and the do not limit the interpretation of the invention. Furthermore, in the present specification and each drawing, the same or similar elements as those described with reference to preceding figures are denoted by the same reference numerals and overlapping explanations may be omitted.

In the present invention, in the case when a single film is processed to form a plurality of films, this plurality of films may have different functions and roles. However, this plurality of films are derived from films formed as the same layer in the same process and have the same layer structure and have the same material. Therefore, these films are defined as being present in the same layer.

Furthermore, in the present specification, expressions such as "upper", "lower" and the like when explaining the drawings express relative positional relationship between the structure of interest and other structures. In the present specification, in a side view, the direction from the insulating surface described later to a sealing film is defined as "upper", and the opposite direction is defined as "lower". In the present specification and the claims, when expressing a mode in which another structure is arranged above a certain structure, in the case of simply denoting "above", unless otherwise noted includes both a case where another structure is arranged directly above and another case where another structure is arranged above a certain structure interposed by another structure so as to be in contact with each other.

When manufacturing a foldable display device, an inorganic insulating film is used as a dielectric layer and a passivation film. However, in the case when the bending radius at the time of folding the display device is small, cracks or peeling may occur in the inorganic insulating film which forms the display device. When cracks or peeling occur in an inorganic insulating film, there is a problem whereby the organic EL element deteriorates due to moisture or oxygen entering from the outside which deteriorates the reliability of the display device.

In view of this problem, it is an object to provide a highly reliable display device.

First Embodiment

A display device 100 according to the present invention is explained while referring to FIG. 1 to FIG. 4N.

[Structure of Display Device]

FIG. 1 shows an example of a pixel layout in a display region 103 of a display device according to an embodiment of the present invention. In the present specification, a state of the display device seen from a direction perpendicular to the screen (display region 103) is referred to as "planar view". In the first embodiment, a structure of a top-gate transistor is illustrated.

FIG. 1 shows 2 rows×3 columns of pixels 109. In FIG. 1, a conductive layer and a semiconductor layer which form the pixel 109 are shown, and the illustration of an insulating film is omitted.

In FIG. 1, a wiring layer 213 and a wiring layer 215 are arranged in a first direction (x direction) of the display region 103, and a wiring layer 216 and a wiring layer 217 are arranged in a second direction (y direction) intersecting the first direction of the display region 103. In addition, a semiconductor layer 211 and a semiconductor layer 212 are arranged so as to overlap the wiring layer 213 and the wiring layer 215. A region where the semiconductor layer 211 and the wiring layer 213 overlap functions as a channel region of a transistor 210 and a region where the semiconductor layer 212 and the wiring layer 214 overlap functions as a channel region of a transistor 220. In addition, the transistor 210 functions as a switching transistor and the transistor 220 functions as a drive transistor. The wiring layer 213 functions as a gate and a scanning line of the transistor, and the wiring layer 215 functions as a source electrode or a drain electrode, a signal line or a power supply line of the transistor. In addition, the wiring layer 216 and the wiring layer 217 function as a source electrode or a drain electrode, a signal line, or a power supply line of a transistor.

One of the source region and the drain region of the semiconductor layer 211 is connected to the wiring layer 217, and the other of the source region and the drain region is connected to a conductive layer 218. In addition, one of the source region and the drain region of the semiconductor layer 212 is connected to the wiring layer 215, and the other of the source region and the drain region of the semiconductor layer 212 is connected to a conductive layer 219. In addition, the semiconductor layer 211 is connected to the conductive layer 214 interposed by the conductive layer 218.

Figure 2:
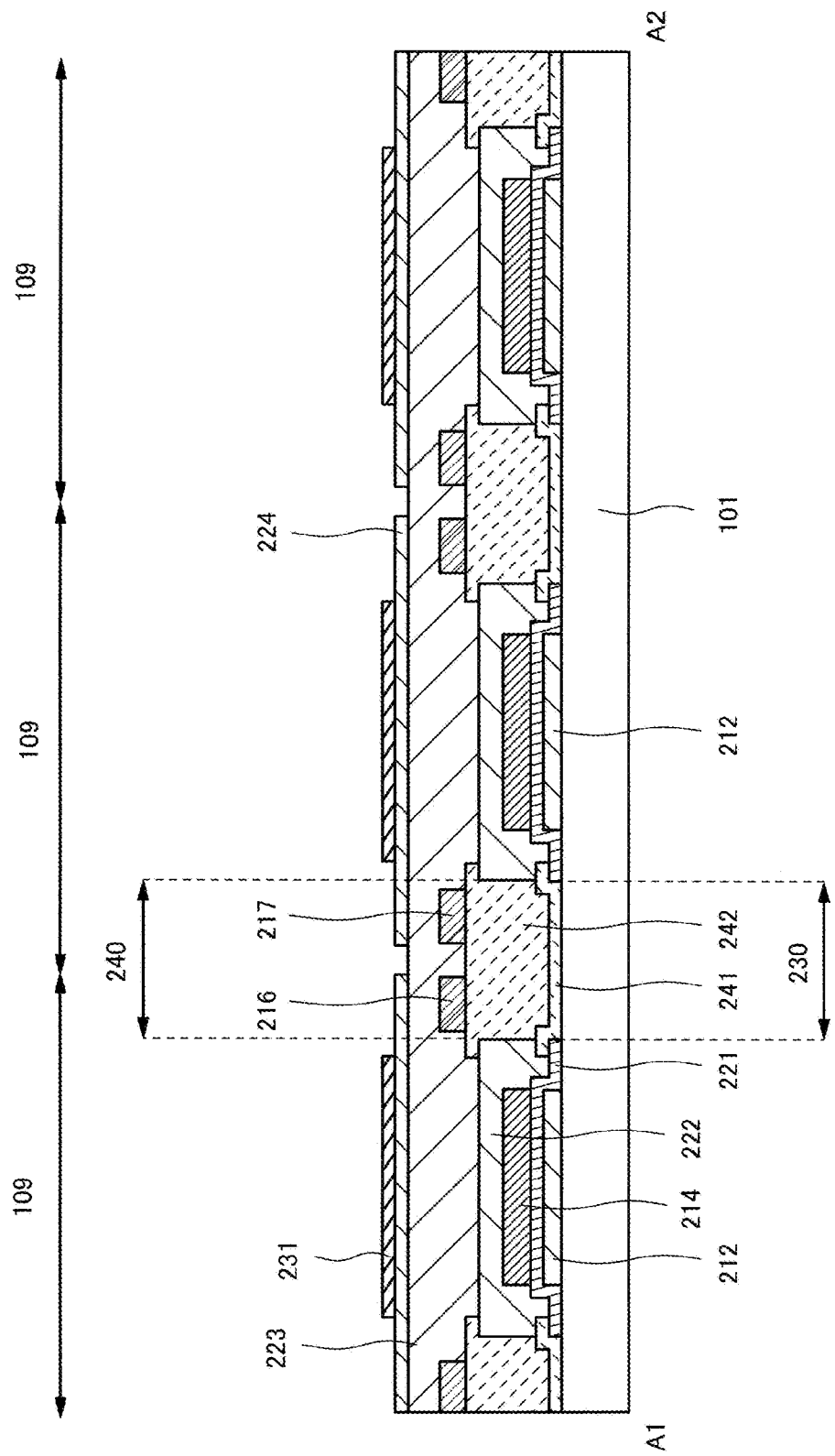
FIG. 2 is a cross-sectional view showing a pixel structure of a display device related to an embodiment of the present invention.

FIG. 2 is a cross-sectional view along the line A1-A2 of the pixel layout shown in FIG. 1. FIG. 2 shows not only the conductive layer and the semiconductor layer but also the insulating film.

The semiconductor layer 212 is arranged on a substrate 101, and a gate insulating film 221 is arranged above the substrate 101 and the semiconductor layer 212. For example, amorphous silicon, polysilicon, an oxide semiconductor or an organic semiconductor can be used as the semiconductor layer 212. In addition, the gate insulating film 221 is formed of an inorganic insulating film including at least one of nitrogen and oxygen and silicon, and for example, silicon oxide or silicon nitride can be used.

For example, while the inorganic insulating film which is used for the gate insulating film 221 or the like has a property which makes it difficult for moisture and oxygen to pass through, it also has rigidity. Therefore, in the case when the bending radius at the time of folding the display device is small, there is a possibility that cracks, or peeling may occur in the inorganic insulating film. When cracks or peeling occur in the inorganic insulating film, there is a problem whereby the light emitting element deteriorates due to moisture or oxygen entering from the outside which deteriorates the reliability of the display device.

Therefore, in the present embodiment, the inorganic insulating film used for the display device is divided for each pixel or for each of a plurality of pixels. In addition, a silicon contained film which is softer than the inorganic insulating film and which can suppress the permeation of moisture and oxygen more than the organic insulating film is filled into in the region where the inorganic insulating film is divided.

In FIG. 2, the gate insulating film 221 is arranged with a groove part 230 so as to divide each pixel 109. In addition, in the groove part 230, a silicon containing film 241 is filled.

Polysiloxane or polysilazane can be used as the silicon-containing film 241. For example, hexamethyldisiloxane (HMDSO), 1,1,3,3-tetramethyldisiloxane, 1,3-divinyltetramethyldisiloxane (DVTMDSO), octamethylcyclotetrasiloxane (OMCATS) can be used as the polysiloxane. Hexamethyldisilazane (HMDS or HMDSN), 1,1,3,3-tetramethyldisilazane (TMDS), or heptamethyldisilazane can be used as the polysilazane.

By arranging the groove part 230 so as to divide each pixel 109 in the gate insulating film 221, it is possible to suppress the occurrence of cracks in the gate insulating film 221 even when the bending radius at the time of bending the display device is small. In addition, by filling the groove part 230 with the silicon-containing film having a property which is softer than the inorganic insulating film, it is possible to alleviate the concentration of stress when bending the display device. In addition, since the silicon-containing film can suppress the entrance of moisture and oxygen more than an organic insulating film, it is possible to suppress deterioration of a light emitting element. In this way, it is possible to improve the reliability of a display device.

In addition, as shown in FIG. 2, it is preferred that the edges of the silicon-containing film 241 and the edges of the gate insulating film 221 overlap each other at their boundary. In this way, it is possible to prevent the silicon-containing film 241 from peeling off at the boundary between the silicon-containing film 241 and the gate insulating film 221 even when the display device is folded.

A conductive layer 214 is arranged above the semiconductor layer 212 interposed by the gate insulating film 221. A capacitance is formed by the semiconductor layer 212, the gate insulating film 221 and the conductive layer 214. In addition, an interlayer insulating film 222 is arranged to cover the conductive layer 214, the gate insulating film 221, and a part of the silicon-containing film. Similar to the gate insulating film 221, the interlayer insulating film 222 is formed from the inorganic insulating film including at least one of nitrogen and oxygen and silicon, and for example, it is possible to use silicon oxide or silicon nitride.

It is preferred to arrange a groove part 240 to divide each pixel 109 also in the interlayer insulating film 222. In addition, as shown in FIG. 2, the groove part 230 and the groove part 240 are arranged to overlap with each other. In addition, a silicon-containing film 242 is filled in the groove part 240. Similar to the silicon-containing film 241, it is possible to use polysiloxane or polysilazane for the silicon-containing film 242.

By arranging the groove part 240 so as to divide each pixel 109 in the interlayer insulating film 222, it is possible to suppress the occurrence of cracks in the interlayer insulating film 222 even when the bending radius at the time of folding the display device is small. In addition, the groove part 240 has a softer property than the inorganic insulating film, and by filling the silicon-containing film, it is possible to alleviate the concentration of stress when the display device is bent. In addition, since the silicon-containing film can suppress the entrance of moisture and oxygen more than the organic insulating film, it is possible to prevent deterioration of a light emitting element. Thereby, it is possible to improve the reliability of a display device.

In the present invention, it is possible to suppress the occurrence of cracks in the inorganic insulating film by providing the groove part so as to divide the inorganic insulating film which forms the display device for each pixel or every plurality of pixels. Therefore, besides the gate insulating film 221 and the interlayer insulating film 222, it is possible to provide the groove part for dividing each pixel or every plurality of pixels in an underlying film or a passivation film and the like. In addition, it is preferred to arrange the silicon-containing film so as to fill the groove part. In this embodiment, although a structure is shown in which the groove part is arranged in both the gate insulating film 221 and the interlayer insulating film 222, a structure is possible in which the groove part is arranged in at least one of the gate insulating film 221 and the interlayer insulating film 222.

As shown in FIG. 2, it is preferred that the edges overlap each other at the boundary between the silicon-containing film 242 and the interlayer insulating film 222. In this way, it is possible to prevent peeling of the silicon-containing film 242 at the boundary between the silicon-containing film 242 and the interlayer insulating film 222 even when the display device is bent.

Here, although the silicon-containing film 241 and the silicon-containing film 242 are respectively formed, a structure is possible in which the silicon-containing film is once filled in the groove part 230 arranged in the gate insulating film 221 and the interlayer insulating film 222. In this case, it is preferred that the end part of the gate insulating film 221 and the end part of the interlayer insulating film 222 overlap with the end part of the silicon-containing film.

In addition, although a case was illustrated in the present embodiment where the groove part 230 and the groove part 240 are overlapped, the present invention is not limited to this structure. The groove part 230 and the groove part 240 may also have regions that do not overlap. For example, a plurality of pixels overlapping with an island shaped gate insulating film 221 and a plurality of pixels overlapping an island shaped interlayer insulating film 222 may not be the same pixel.

In addition, it is possible to adjust the hardness of the silicon-containing film 241 and the silicon-containing film 242 by the flow rate of oxygen during film formation. Therefore, the amount of oxygen may be different between the silicon-containing film 241 and the silicon-containing film 242. For example, the amount of oxygen included in the silicon-containing film 241 can be set larger than the amount of oxygen included in the silicon-containing film 242.

The wiring layer 216 and the wiring layer 217 are arranged above the silicon-containing film 242. A planarization film 223 is arranged above the interlayer insulating film 222, the wiring layer 216 and the wiring layer 217. The planarization film 223 is formed to include an organic resin material. For example, known organic resin materials such as polyimide, polyamide, acrylic, epoxy and the like can be used as the organic resin material. These materials are capable of forming a film by a solution coating method and provide a high flattening effect. The planarization film 223 is not limited to a single layer structure and may have a stacked structure of a layer containing an organic resin material and an inorganic insulating film.

An insulating film 224 is arranged above the planarization film 223. The insulating film 224 is preferred to have a barrier function against moisture and oxygen and it is preferred to use an inorganic insulating film such as a silicon oxide film or a silicon nitride film.

A pixel electrode 231 is arranged above the insulating film 224. The pixel electrode 231 is arranged in a region surrounded by the groove part 230 or the groove part 240. In the display device of the present embodiment, the pixel electrode 231 functions as an anode forming a light emitting element. The pixel electrode 231 has a different structure depending on whether it is a top emission type or a bottom emission type electrode. For example, in the case of a top emission type electrode, it is preferred to use a metal film having high reflectance as the pixel electrode 231 or to use a stacked layer structure of a transparent conductive film with a high work function such as an indium oxide type transparent conductive film (for example, ITO) or zinc oxide type transparent conductive film (for example, IZO, ZnO) and a metal film. On the other hand, in the case of a bottom emission type electrode, the transparent conductive film described above is used as the pixel electrode 231. In the present embodiment, a top emission type organic EL display device is explained as an example.

Figure 3:
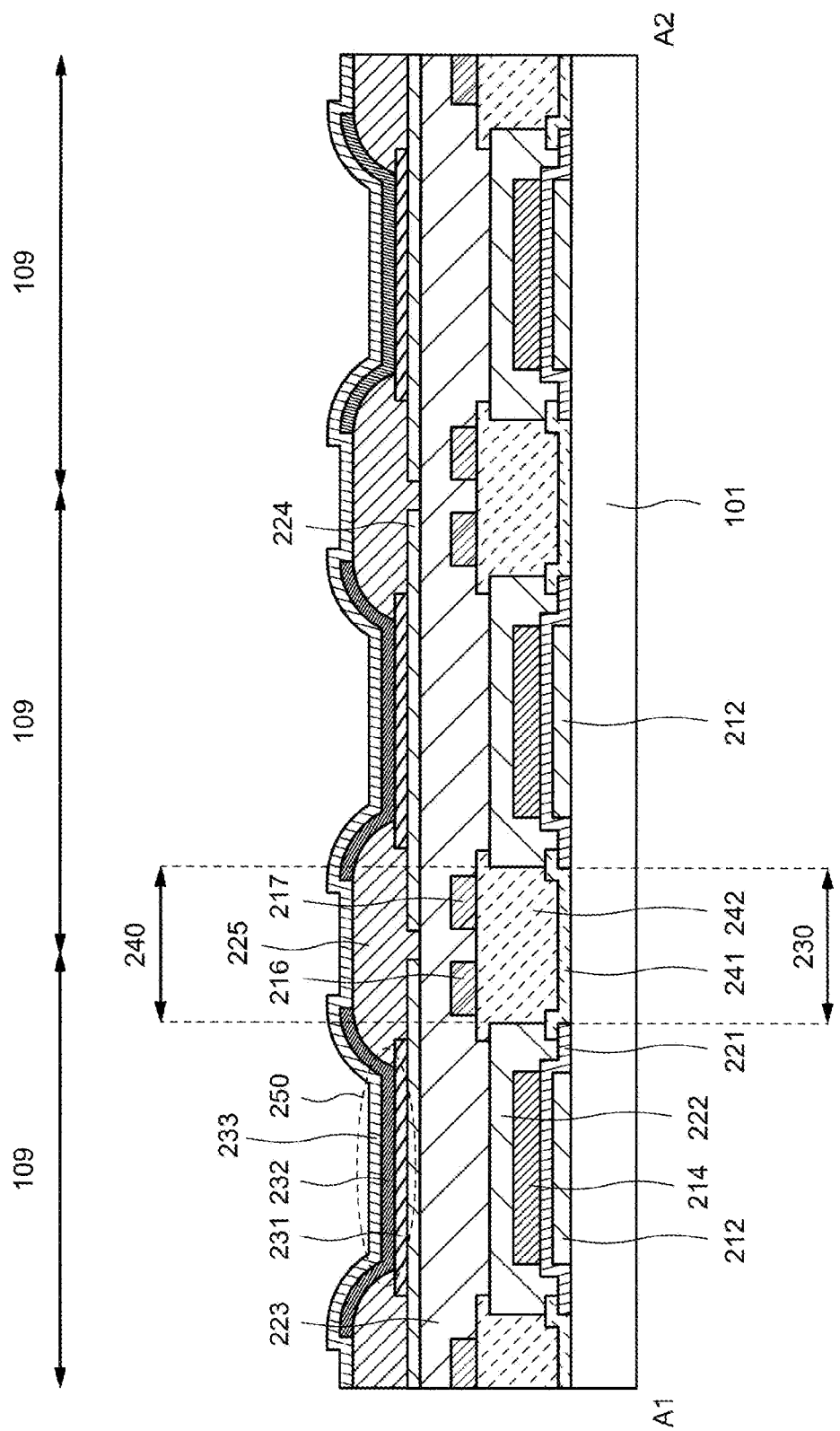
FIG. 3 is a cross-sectional view showing a pixel structure of a display device related to an embodiment of the present invention.

Next, FIG. 3 shows a cross-sectional view in the case where an insulating film, an organic layer and an opposing electrode are arranged in addition to the structure shown in FIG. 2.

The end part of the pixel electrode 231 is covered by an insulating film 225. A resin material such as polyimide, polyamide, acrylic, epoxy or siloxane can be used as the insulating film 225. The insulating film 225 has an opening part which exposes a part of the pixel electrode 231. The insulating film 225 is arranged between adjacent pixel electrodes 231 and also functions as a member that covers an end part (edge part) of the pixel electrode 231 and isolates the adjacent pixel electrode 231. As a result, the insulating film 225 is also generally called a "partition wall" or a "bank". A light emitting region of the light emitting element 250 is defined by a part of the pixel electrode 231 which is exposed from the insulating film 225. The opening part of the insulating film 225 is preferred to be arranged so that its inner wall has a tapered shape. In this way, it is possible to reduce coverage defects at the end part of the pixel electrode 231 at the time of forming a light emitting layer described later. In addition, when seen in a planar view, the opening part of the insulating film 225 is arranged so as not to overlap the groove part 230 or the groove part 240.

An organic layer 232 which is arranged to cover the opening part of the insulating film 225 and is formed from an organic material is arranged above the pixel electrode 231. The organic layer 232 has at least the light emitting layer formed from an organic material and functions as a light emitting part of the light emitting element. The organic layer 232 may include various charge transport layers such as an electron injection layer, an electron transport layer, a hole injection layer, and a hole transport layer in addition to the light emitting layer. The organic layer 232 is arranged to cover the light emitting region, that is, so as to cover the opening part of the insulating film 225 in the light emitting region.

Furthermore, in the present embodiment, a structure in which the light emitting layer that emits light of a desired color is arranged in the organic layer 232 and the organic layer 232 having different light emitting layers is formed over each pixel electrode 231, thereby displaying each color of RGB. That is, in the present embodiment, the organic layer 232 is discontinuous between adjacent pixel electrodes 231. Furthermore, the various charge transport layers may be discontinuous or may be continuous between adjacent pixel electrodes 231. A known structure or a known material can be used for the organic layer 232 and is not particularly limited to the structure of the present embodiment. In addition, the organic layer 232 has the light emitting layer that emits white light, and each color of RGB may be displayed through a color filter. In this case, the organic layer 232 may also be arranged above the insulating film 225.

An opposing electrode 233 arranged to cover the organic layer 232 and a part of the insulating film 225 is arranged. The opposing electrode 233 functions as a cathode which forms a light emitting element 250. Since the display device 100 of the present embodiment is a top emission type, a transparent electrode is used as the opposing electrode 233. An MgAg thin film or a transparent conductive film (ITO or IZO) is used as the thin film forming the transparent electrode. The opposing electrode 233 is also arranged above the insulating film 225 so as to straddle between pixels 109. The opposing electrode 233 is electrically connected to an external terminal via a lower conductive layer in the periphery region in the vicinity of the end of the display region 103. As described above, in the present embodiment, the light emitting element 250 is formed by a part of the pixel electrode 231 (anode), the organic layer 232 (light emitting part) and the opposing electrode 233 (cathode) which is exposed from the insulating film 225.

As described above, it is possible to suppress the occurrence of cracks in an inorganic insulating film by arranging groove parts so as to divide the inorganic insulating film which forms the display device for each pixel or every plurality of pixels. In addition, by filling the groove parts with the silicon-containing film having a softer property than the inorganic insulating film, it is possible to alleviate the concentration of stress at the time of bending the display device. In addition, since the silicon-containing film can suppress the entrance of moisture and oxygen more than the organic insulating film, it is possible to suppress the deterioration of a light emitting element. Thereby, it is possible to improve the reliability of a display device.

[Manufacturing Method of a Display Device]

Figure 4A:
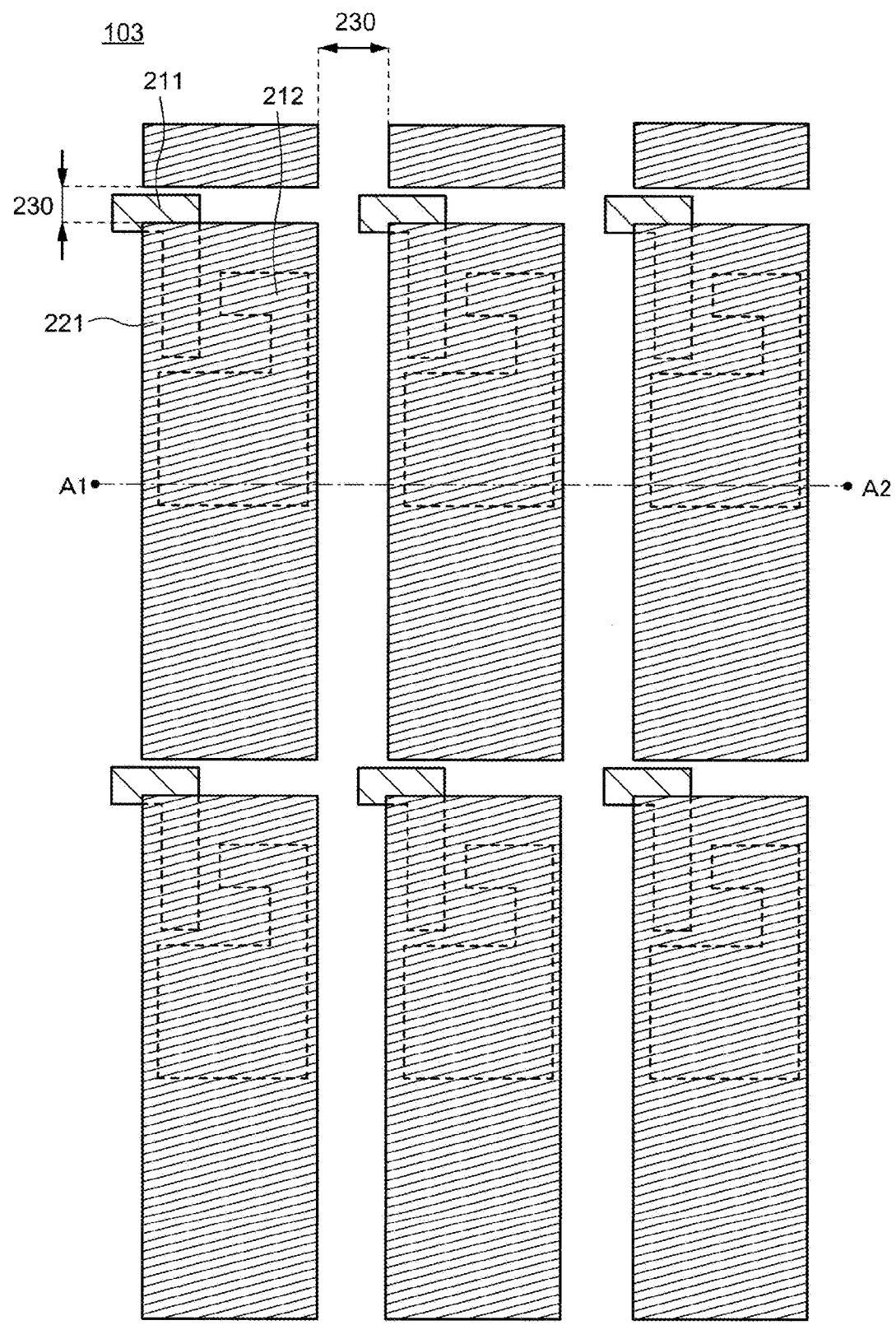
FIG. 4A is a planar view of a manufacturing method of a display device related to an embodiment of the present invention.

A method of manufacturing the display device according to the present embodiment is explained while referring to FIG. 4A to FIG. 4N. Specifically, a process of forming a pixel circuit to a light emitting element is explained. FIG. 4A, FIG. 4C, FIG. 4E, FIG. 4G, FIG. 4I, FIG. 4K, FIG. 4M are planar views of a display device and FIG. 4B, FIG. 4D, FIG. 4F, FIG. 4H, FIG. 4J, FIGS. 4L and 4N are cross-sectional views along the line A1-A2 in the planar view of the display device.

First, the semiconductor layer 211 and the semiconductor layer 212 are formed above the substrate 101. The flexible substrate (polyimide, polyethylene terephthalate, polyethylene naphthalate, triacetyl cellulose, cyclic olefin copolymer, cycloolefin polymer, other flexible resin substrate) can be used as the substrate 101. By using the flexible resin substrate, it is possible to bend or fold the display device. In addition, a material that transmits light is preferred as the substrate 101. For example, polysilicon, amorphous silicon or oxide semiconductor can be used as the semiconductor layer 211 and the semiconductor layer 212.

Next, a gate insulating film is formed above the semiconductor layer 211 and the semiconductor layer 212. The gate insulating film is preferably the inorganic insulating film including at least one of nitrogen and oxygen and silicon. For example, the inorganic insulating film such as silicon oxide ($Si_xO_y$), silicon nitride ($Si_xN_y$), silicon oxynitride ($SiO_xN_y$), silicon nitride oxide ($SiN_xO_y$), aluminum oxide ($Al_xO_y$), aluminum nitride ($Al_xN_y$), aluminum oxynitride ($Al_xO_yN_z$) or aluminum nitride oxide ($Al_xN_yO_z$) or the like can be used as the gate insulating film (x, y, z are arbitrary).

Figure 4B:
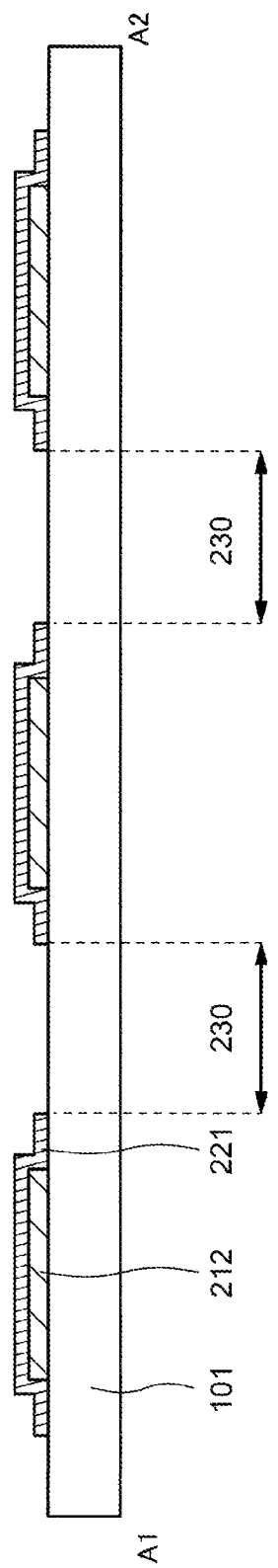
FIG. 4B is a cross-sectional view of a manufacturing method of a display device related to an embodiment of the present invention.

Next, as shown in FIG. 4A and FIG. 4B, the groove part 230 is formed so as to divide the gate insulating film. The groove part 230 is formed in a lattice shape in the display region 103. In other words, the gate insulating film 221 is patterned into an island shape. In the present embodiment, although a case is explained where the gate insulating film is patterned in an island shape for each pixel, the present invention is not limited to this structure. For example, the gate insulating film may be patterned in an island shape for each of a plurality of pixels.

Figure 4C:
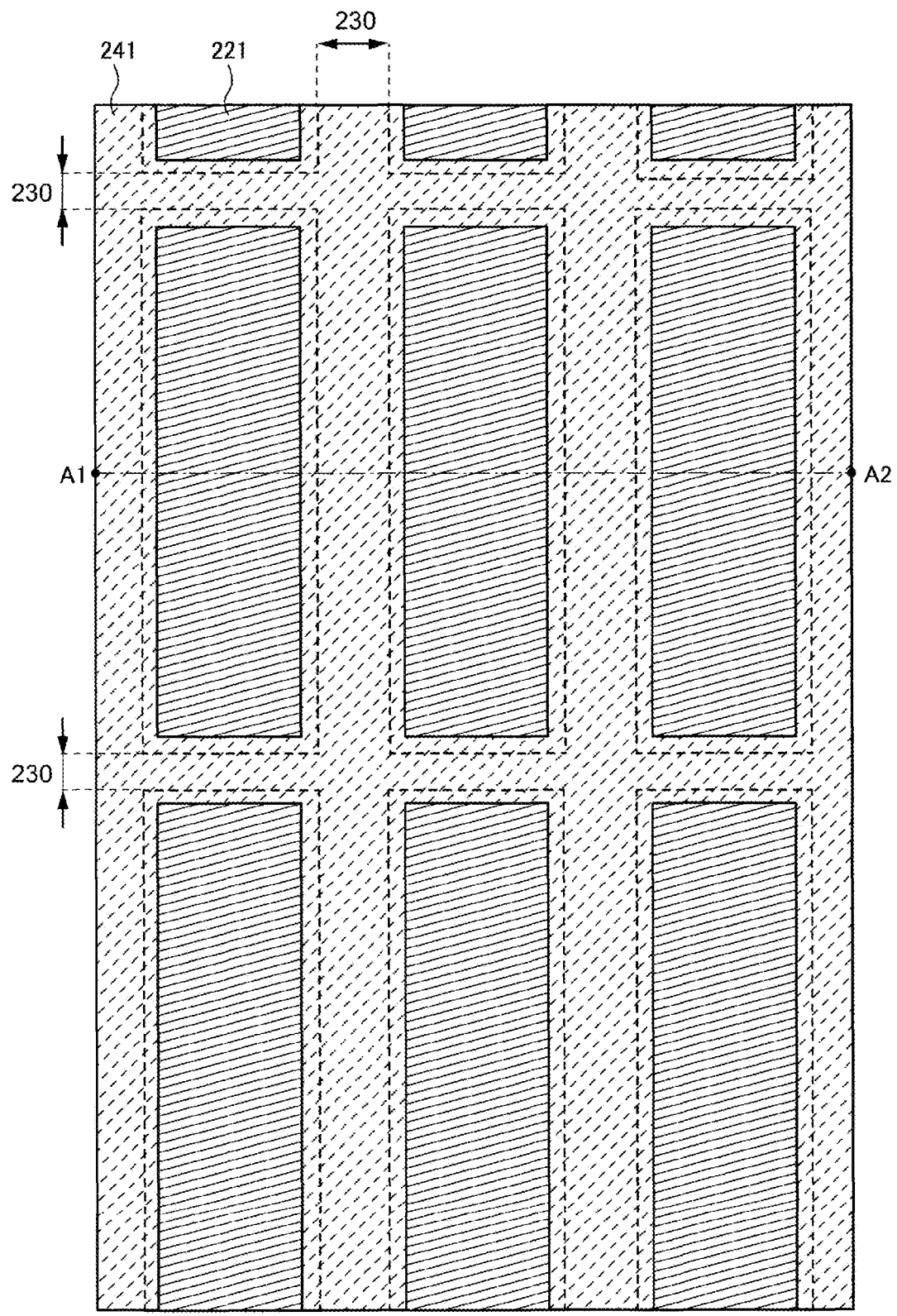
FIG. 4C is a planar view of a manufacturing method of a display device related to an embodiment of the present invention.
Figure 4D:
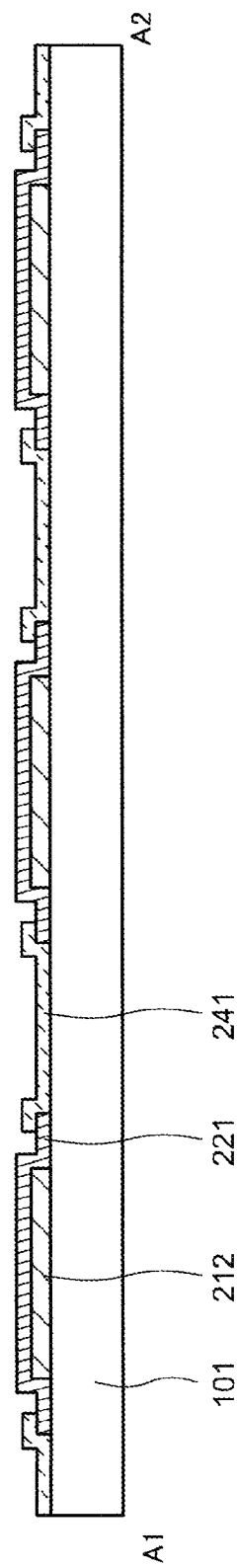
FIG. 4D is a cross-sectional view of a manufacturing method of a display device related to an embodiment of the present invention.

Next, as shown in FIG. 4C and FIG. 4D, the silicon-containing film 241 is formed in the groove part 230. The silicon-containing film 241 is formed from a polysiloxane such as hexamethyldisiloxane (HMDSO), 1,1,3,3-tetramethyldisiloxane, 1,3-divinyltetramethyldisiloxane (DVTMDSO), octamethylcyclotetrasiloxane (OMCATS). In addition, polysilazane such as hexamethyldisilazane (HMDS or HMDSN), 1,1,3,3-tetramethyldisilazane (TMDS), or heptamethyldisilazane can be used as the silicon-containing film 241. By patterning the silicon-containing film 241, the end part of the silicon-containing film 241 is arranged to overlap the end part of the gate insulating film 221.

The silicon-containing film 241 can be formed by, for example, a CVD method. At this time, it is possible to adjust the hardness of the silicon-containing film 241 by the flow rate of oxygen gas. For example, by decreasing the flow rate of the oxygen gas with respect to the flow rate of a gas containing silicon, the silicon-containing film 241 becomes a hard film, and by increasing the flow rate of the oxygen gas with respect to the flow rate of the gas containing silicon, the silicon-containing film 241 becomes a soft film.

Figure 4E:
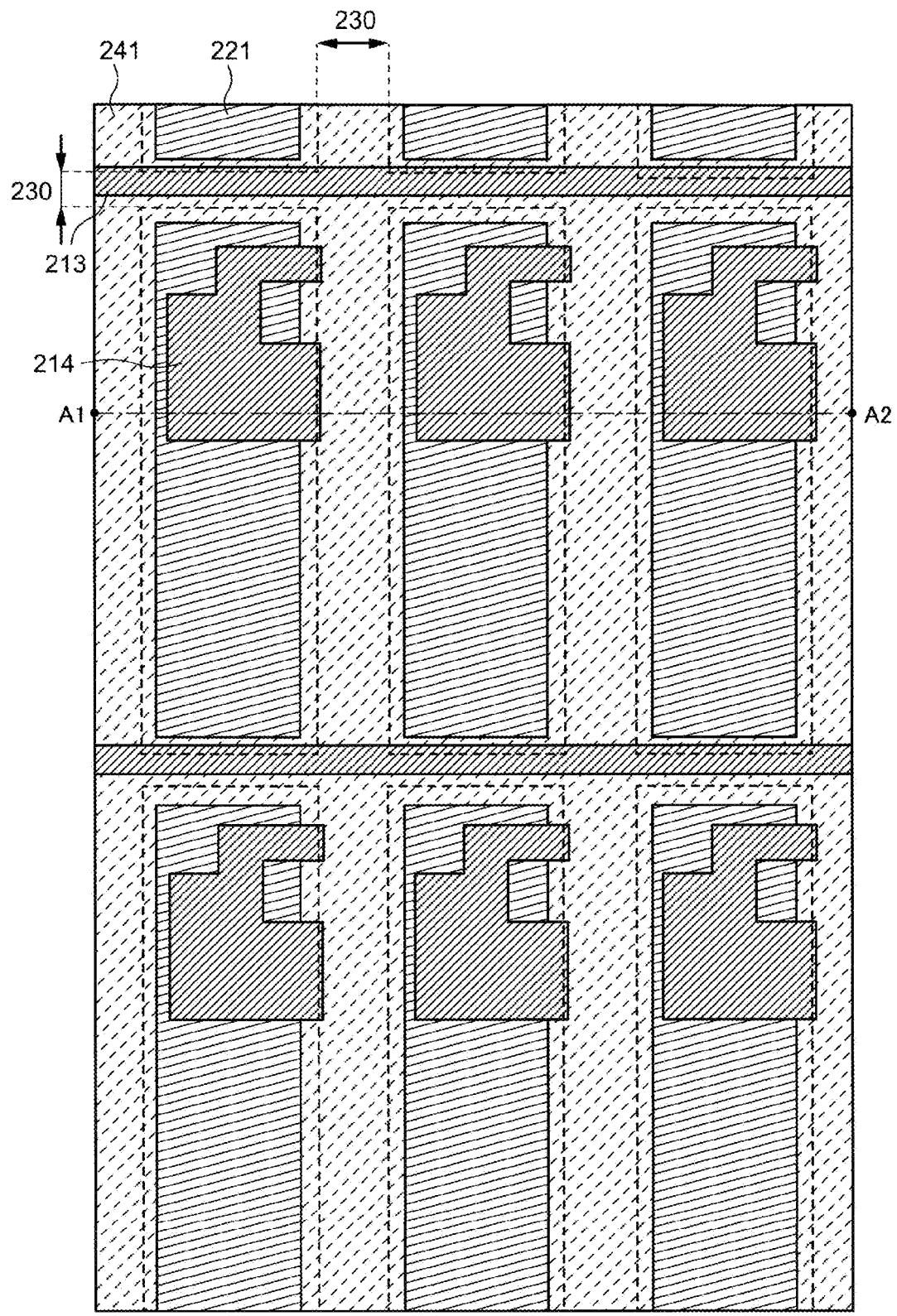
FIG. 4E is a planar view of a manufacturing method of a display device related to an embodiment of the present invention.
Figure 4F:
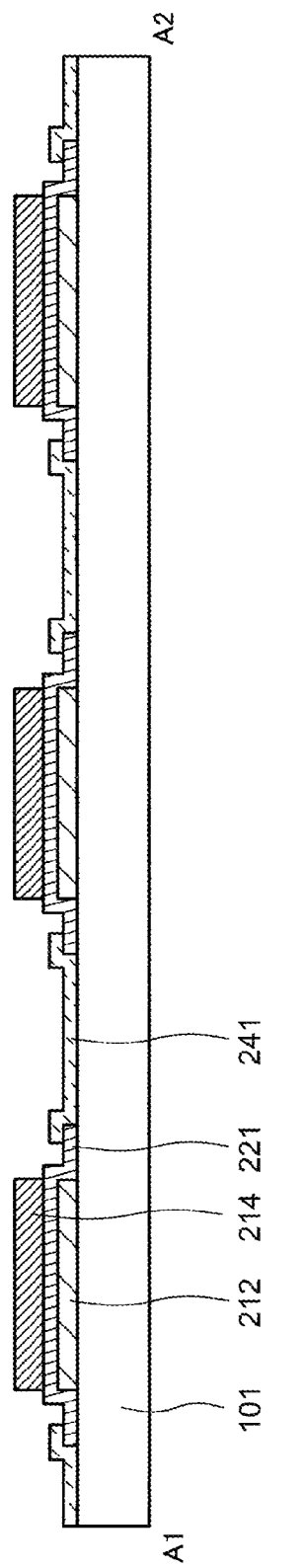
FIG. 4F is a cross-sectional view of a manufacturing method of a display device related to an embodiment of the present invention.

Next, a conductive film is formed above the silicon-containing film 241 and the gate insulating film 221 and the conductive film is patterned. In this way, as shown in FIG. 4E and FIG. 4F, the wiring layer 213 can be formed above the silicon-containing film 241, and the conductive layer 214 can be formed above the gate insulating film 221. It is possible to form the wiring layer 213 and the conductive layer 214 from a metal material such as copper, molybdenum, tantalum, tungsten, aluminum or an alloy material.

Next, the interlayer insulating film is formed above the wiring layer 213 and the gate insulating film 221. The interlayer insulating film is preferred to be an inorganic insulating film containing at least one of nitrogen and oxygen and silicon. For example, an inorganic insulating film such as silicon nitride (SixNy), silicon oxynitride (SiOxNy), silicon nitride oxide (SiNxOy), aluminum oxide (AlxOy), aluminum nitride (AlxNy), aluminum oxynitride (AlxOyNz) or aluminum nitride oxide (AlxNyOz) or the like can be used as the interlayer insulating film (x, y, z are arbitrary). The interlayer insulating film used here is preferred to contain at least nitrogen considering gas barrier properties.

Figure 4G:
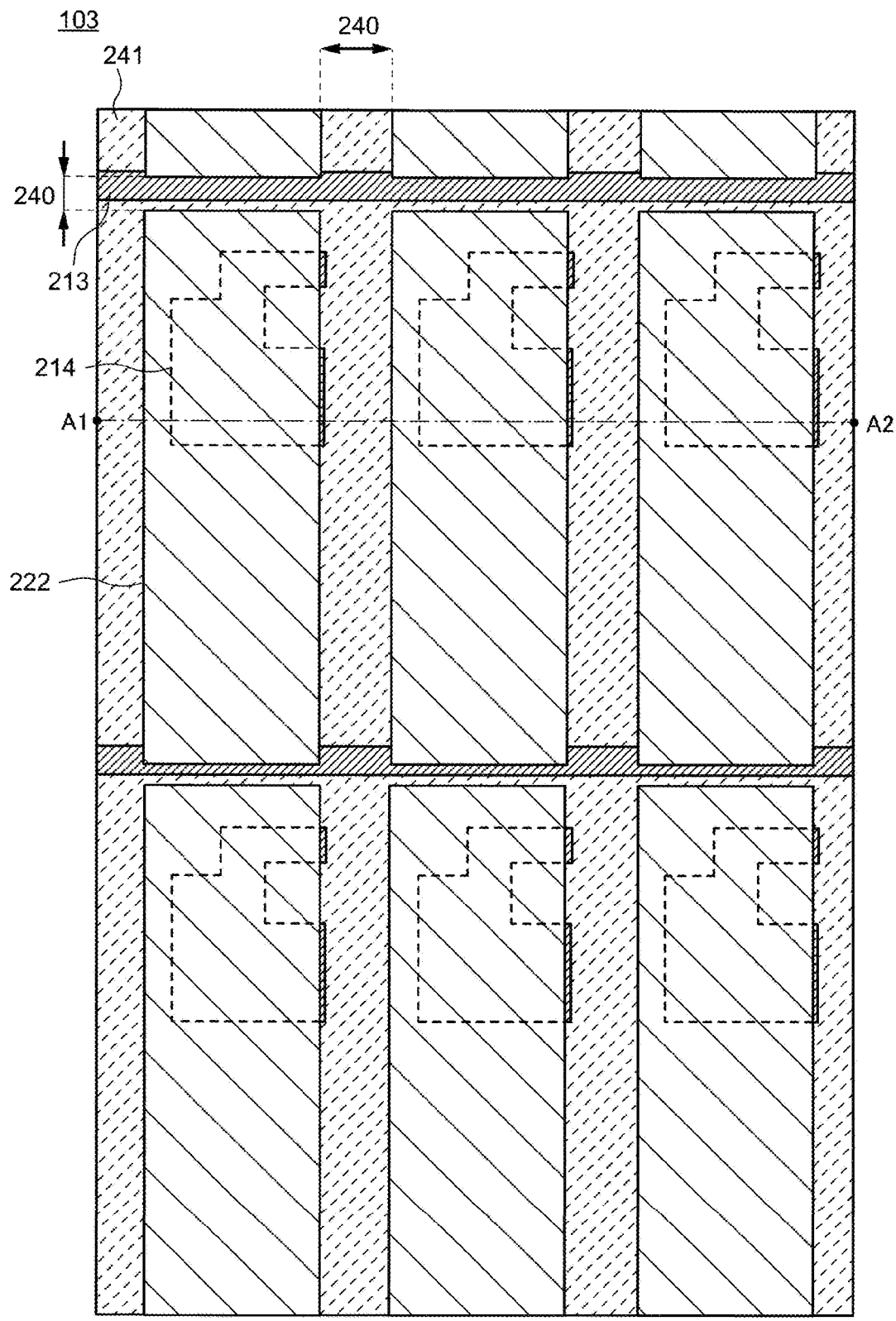
FIG. 4G is a planar view of a manufacturing method of a display device related to an embodiment of the present invention.
Figure 4H:
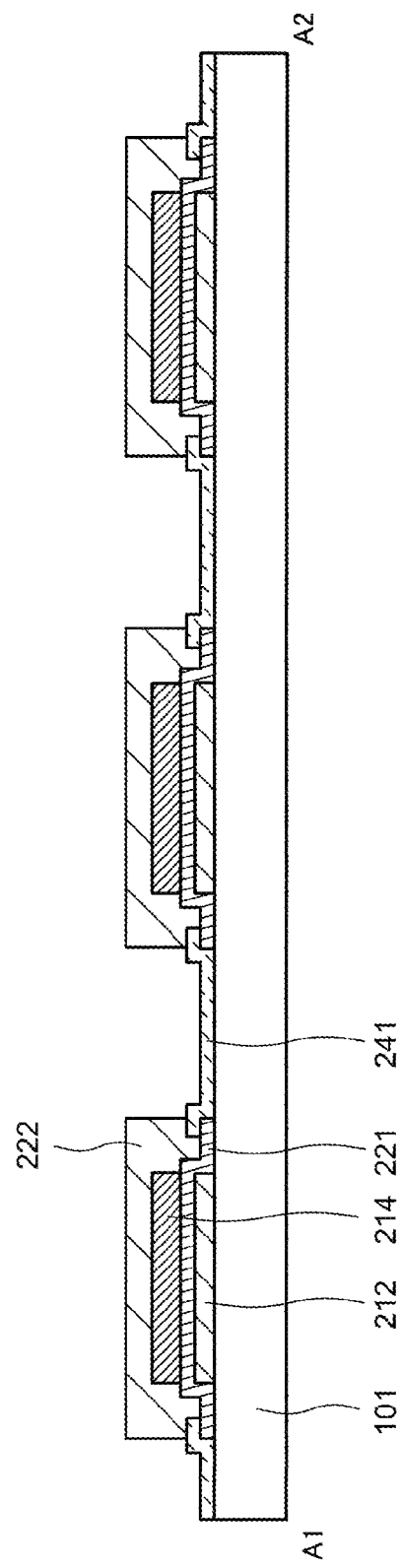
FIG. 4H is a cross-sectional view of a manufacturing method of a display device related to an embodiment of the present invention.

Next, as shown in FIG. 4G and FIG. 4H, the groove part 240 is formed so as to divide the interlayer insulating film. The groove part 240 is formed in a lattice shape in the display region 103. In other words, the interlayer insulating film is patterned into an island shape. In this way, an island shaped interlayer insulating film 222 is formed. In the present embodiment, although the case of patterning the interlayer insulating film in an island shape for each pixel is explained, the present invention is not limited to this structure. For example, the interlayer insulating film may be patterned in the island shape for each of a plurality of pixels.

In the present embodiment, although an example is explained in which the area where the island shaped interlayer insulating film 222 is formed and the area where the gate insulating film 221 is formed have approximately the same area, the present invention is not limited to this structure. The area where the island shaped gate insulating film 221 is formed and the area where the island shaped interlayer insulating film 222 is formed may be different areas.

Figure 4I:
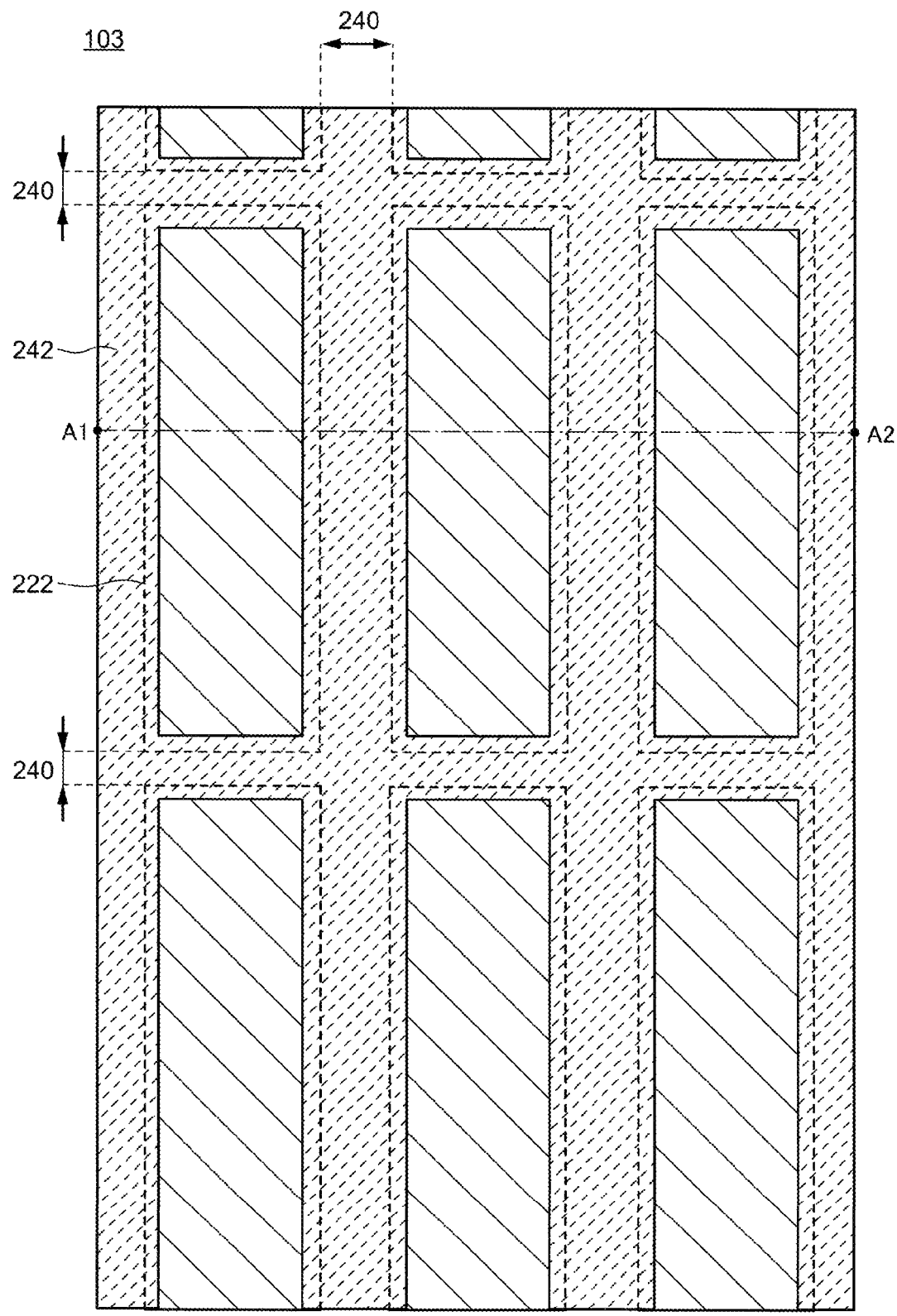
FIG. 4I is a planar view of a manufacturing method of a display device related to an embodiment of the present invention.
Figure 4J:
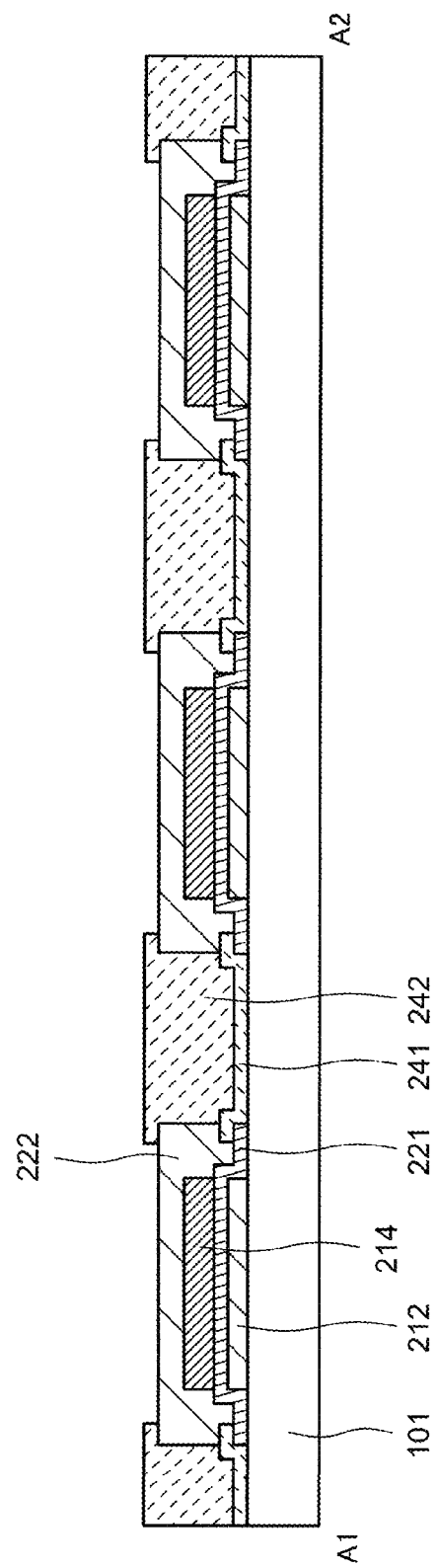
FIG. 4J is a cross-sectional view of a manufacturing method of a display device related to an embodiment of the present invention.

Next, as shown in FIG. 4I and FIG. 4J, the silicon-containing film 242 is formed in the groove part 240. The silicon-containing film 242 can be formed from a polysiloxane such as hexamethyldisiloxane (HMDSO), 1,1,3,3-tetramethyldisiloxane, 1,3-divinyltetramethyldisiloxane (DVTMDSO), octamethylcyclotetrasiloxane (OMCATS). In addition, polysilazane such as hexamethyldisilazane (HMDS or HMDSN), 1,1,3,3-tetramethyldisilazane (TMDS), or heptamethyldisilazane can be used as the silicon-containing film 241.

Figure 4K:
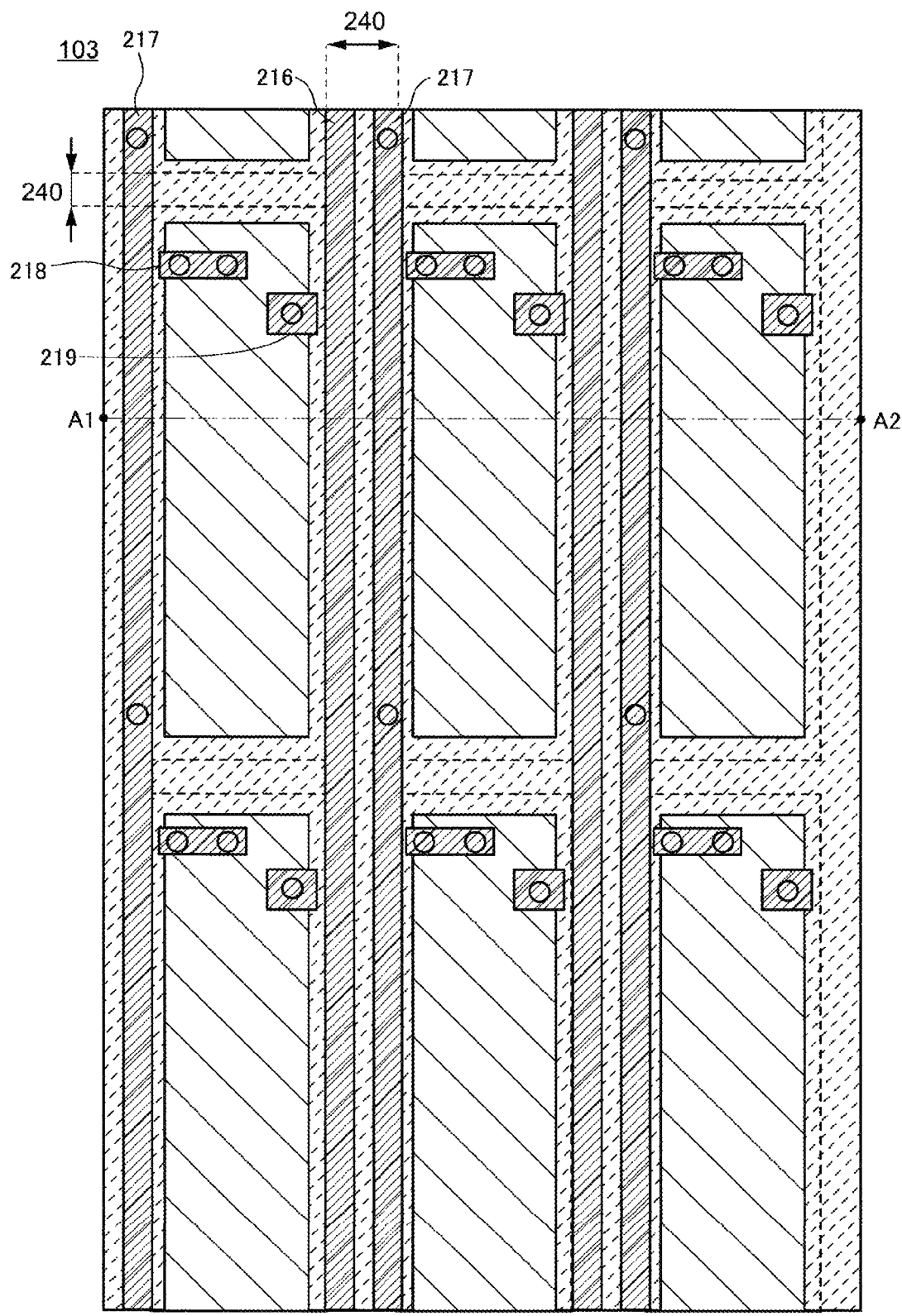
FIG. 4K is a planar view of a manufacturing method of a display device related to an embodiment of the present invention.
Figure 4L:
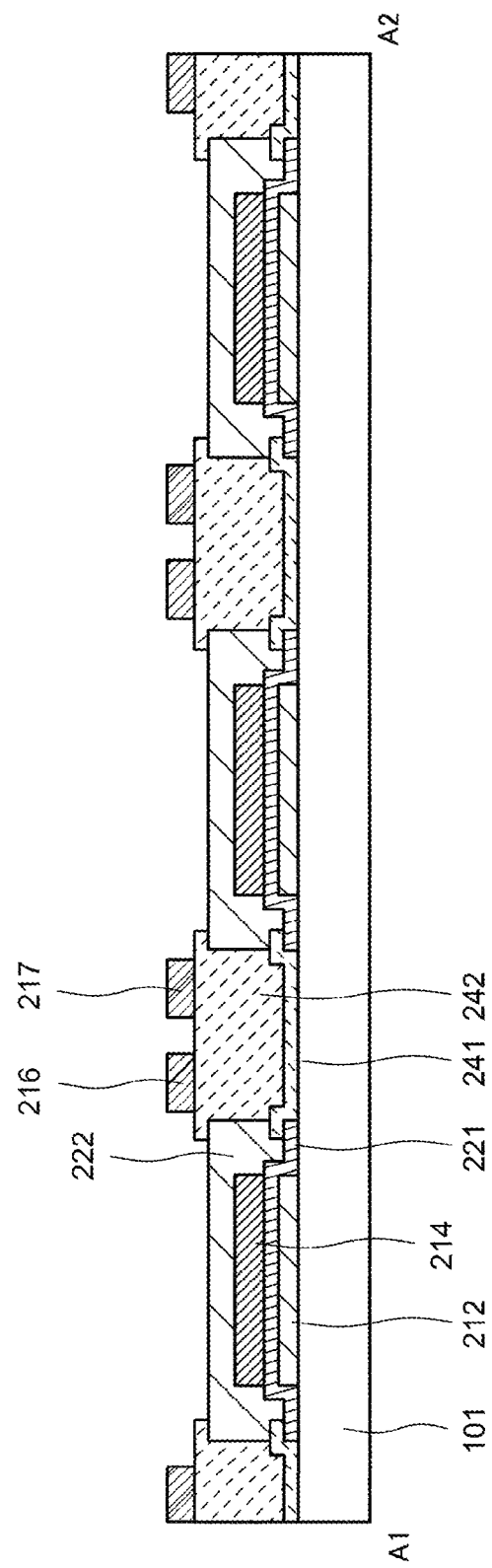
FIG. 4L is a cross-sectional view of a manufacturing method of a display device related to an embodiment of the present invention.

Next, contact holes which reach the semiconductor layer 211 and the semiconductor layer 212 are formed in the interlayer insulating film 222 and the gate insulating film 221. Following this, a conductive film is formed above the silicon-containing film 242 and the interlayer insulating film 222 and the conductive film is patterned. In this way, as shown in FIG. 4K and FIG. 4L, the wiring layer 216 and the wiring layer 217 are formed above the silicon-containing film 242 and the conductive layer 218 and the conductive layer 219 can be formed above the interlayer insulating film 222.

In addition, the wiring layer 217 is connected to one of the source region and the drain region of the semiconductor layer 211, and the conductive layer 218 is connected to the other of the source region and the drain region of the semiconductor layer 211. In addition, the conductive layer 218 is connected to one of the source region and the drain region of the semiconductor layer 212, and the conductive layer 219 is connected to the other of the source region and the drain region of the semiconductor layer 212. In addition, the wiring layer 216, the wiring layer 217, the conductive layer 218, and the conductive layer 219 can be formed using a metal material such as copper, molybdenum, tantalum, tungsten, and aluminum or an alloy material.

Next, the planarization film 223 is formed above the silicon-containing film 242, the wiring layer 216 and the wiring layer 217. The planarization film 223 is formed using an organic resin material. For example, known organic resin materials such as polyimide, polyamide, acrylic, epoxy and the like can be used as the organic resin material.

Next, the insulating film 224 is formed above the planarization film 223. The insulating film 224 is preferred to have a barrier function against moisture and oxygen, and it is preferred to use an inorganic insulating film such as a silicon oxide film or a silicon nitride film. In addition, a groove part is formed in the insulating film 224 so as to divide the pixel 109. In this way, moisture and degas which are released from the planarizing film 223 can be released through the groove part arranged in the insulating film 225 through a heat treatment performed after the formation of the insulating film 225 to be formed later.

Figure 4M:
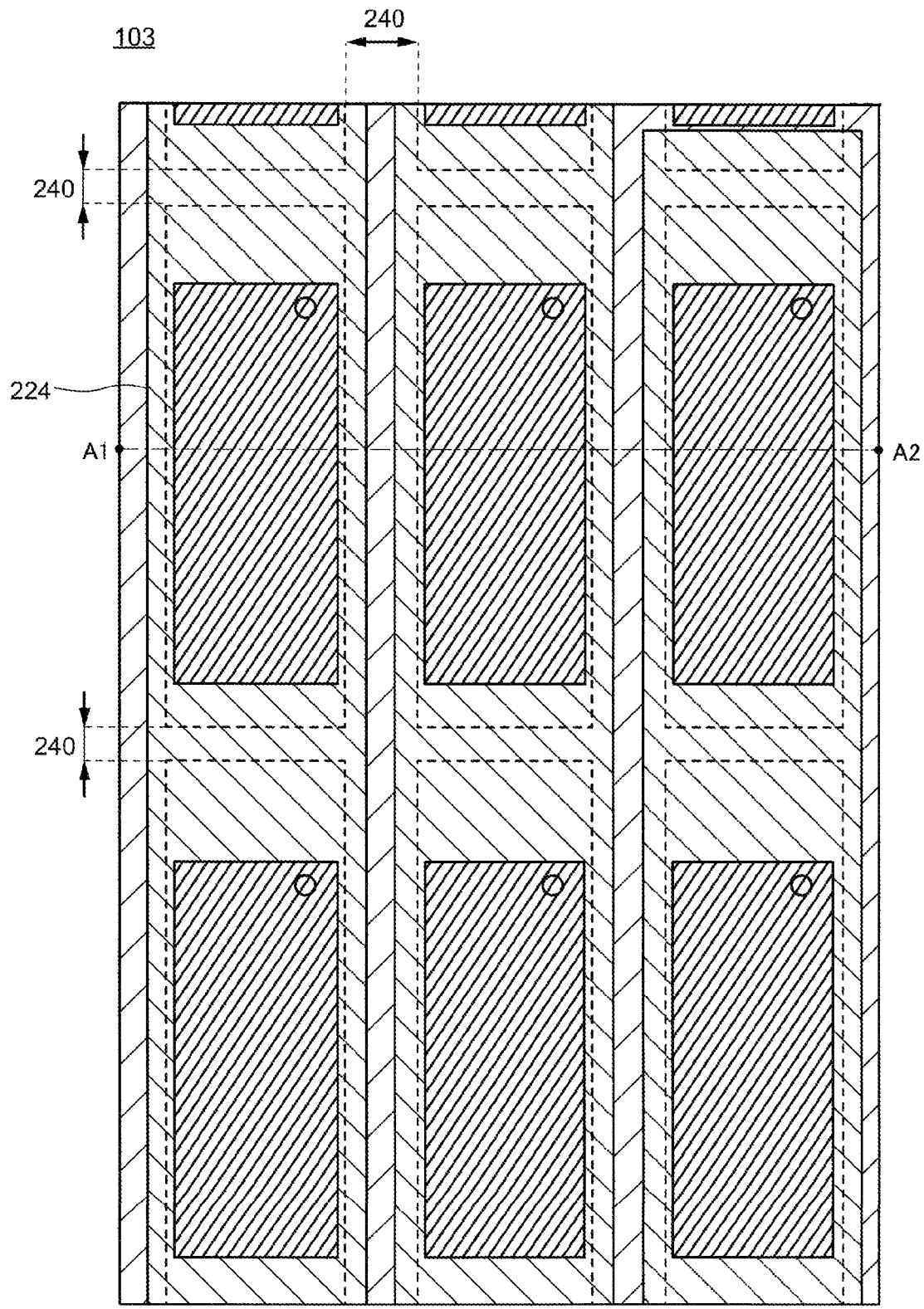
FIG. 4M is a planar view of a manufacturing method of a display device related to an embodiment of the present invention.

Next, contact holes which reach the conductive layer 219 are formed in the insulating film 224 and the planarization film 223. Next, as shown in FIG. 4M and FIG. 4N, the pixel electrode 231 is formed above the insulating film 224. The pixel electrode 231 is formed to overlap a region surrounded by the groove part 230 or the groove part 240. Furthermore, in FIG. 4M, the groove part 240 is shown in order to illustrate the positional relationship between the groove part 240 and the pixel electrode 231. Since the display device of the present embodiment is a top emission type, a stacked structure in which a metal film having a high reflectance is used as the pixel electrode 231 and an indium oxide-based transparent conductive film (for example, ITO) or a zinc oxide-based transparent conductive film (for example, IZO, ZnO) which has a high work function is used.

Next, an insulating film is formed above the pixel electrode 231 and patterned to form the insulating film 225 which functions as a bank. An opening part is formed in the insulating film 225 so as to expose a part of the pixel electrode 231. A resin material such as polyimide, polyamide, acrylic, epoxy or siloxane can be used as the insulating film 225.

Next, the organic layer 232 is formed above the pixel electrode 231 to cover the opening part of the insulating film 225. The organic layer 232 has at least the light emitting layer formed from an organic material and functions as the light emitting part of the light emitting element 250. The organic layer 232 may include various charge transport layers such as an electron injection layer, an electron transport layer, a hole injection layer and a hole transport layer in addition to the light emitting layer. The organic layer 232 is formed to cover the light emitting region, that is, to cover the opening part of the insulating film 225 in the light emitting region.

Next, the opposing electrode 233 is formed to cover the organic layer 232 and a part of the insulating film 225. The opposing electrode 233 functions as the cathode which forms the light emitting element 250. Since the display device of the present embodiment is a top emission type, a transparent electrode is used as the opposing electrode 233. An MgAg thin film or a transparent conductive film (ITO or IZO) is used as the thin film forming the transparent electrode. The opposing electrode 233 is also arranged over the insulating film 225 so as to bridge the pixels 109. The opposing electrode 233 is electrically connected to an external terminal via a lower conductive layer in the periphery region in the vicinity of the end part of the display region 103. As described above, in the present embodiment, the light emitting element 250 is formed by a part of the pixel electrode 231 (anode), the organic layer 232 (light emitting part) and the opposing electrode 233 (cathode) which is exposed from the insulating film 225.

The display device according to the present embodiment can be manufactured through the steps described above.

As explained above, by providing the groove parts so as to divide the inorganic insulating film which forms the display device according to the present embodiment for each pixel or every plurality of pixels, it is confirmed that it is possible to suppress the generation of cracks in the inorganic insulating film. In addition, by filling the silicon-containing film in the groove parts with a substance having a softer property than the inorganic insulating film, it is possible to alleviate the concentration of stress when bending the display device. In addition, since the silicon-containing film can suppress the entrance of moisture and oxygen more than the organic insulating film, it is possible to suppress the deterioration of a light emitting element. Thereby, it is possible to improve the reliability of a display device.

In the method for manufacturing a display device described above, the flow rate of oxygen may be different when the silicon-containing film 241 and the silicon-containing film 242 are formed. That is, when forming the silicon-containing film 241, the flow rate of the oxygen gas may be increased with respect to the flow rate of the gas containing silicon and when forming the silicon-containing film 241, the flow rate of the oxygen gas may be decreased with respect to the flow rate of gas containing silicon. In this way, the amount of oxygen included in the silicon-containing film 241 is larger than the amount of oxygen included in the silicon-containing film 242. In addition, the silicon-containing film 241 is a softer film than the silicon-containing film 242.

Second Embodiment

Figure 5:
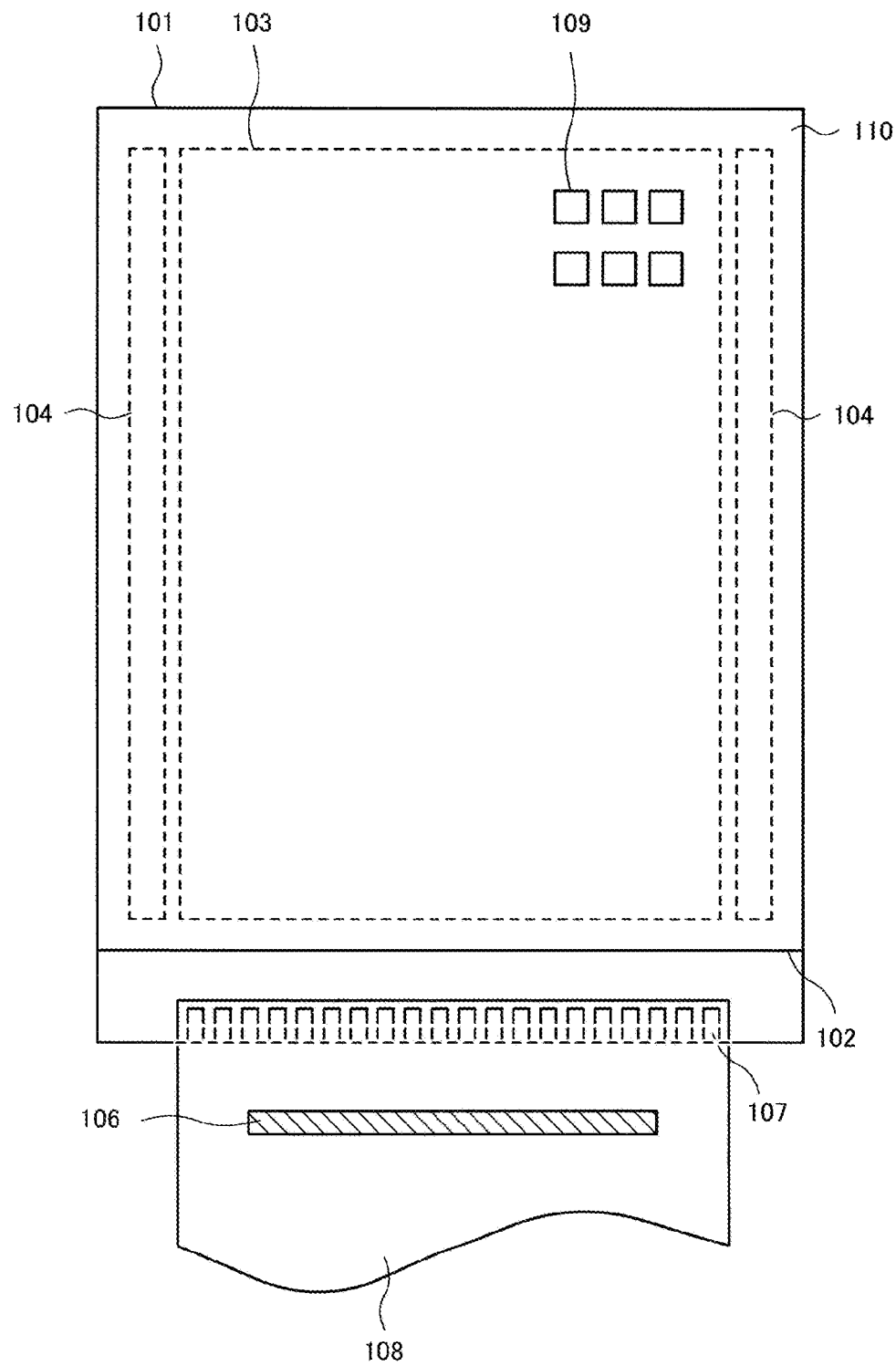
FIG. 5 is a planar view showing a structure of a display device related to an embodiment of the present invention.

FIG. 5 is a schematic view showing a structure of the display device 100 according to an embodiment of the present invention and shows a schematic structure when the display device 100 is viewed in a planar view. Furthermore, explanations of parts which have the same structure as that of the first embodiment are omitted.

As shown in FIG. 5, the display device 100 includes the display region 103 formed above an insulating surface, a scanning line driver circuit 104 arranged in a periphery region 110, and a driver IC 106. The light emitting element having an organic layer formed from the organic material is arranged in the display region 103. In addition, the periphery region 110 surrounds the periphery of the display region 103. Furthermore, the periphery region 110 is a region of the substrate 101 excluding the display region 103. The driver IC 106 functions as a control unit which provides signals to the scanning line driving circuit 104. In addition, a data line driving circuit is incorporated in the driver IC 106. In addition, although the driver IC 106 is arranged externally on a flexible printed substrate 108, it may also be arranged on the substrate 101. The flexible printed substrate 108 is connected to terminals 107 arranged in the periphery region 110.

Here, the insulating surface is the surface of the substrate 101. The substrate 101 supports each layer such as the pixel electrode and the insulating layer arranged on the surface thereof. The flexible substrate (polyimide, polyethylene terephthalate, polyethylene naphthalate, triacetyl cellulose, cyclic olefin copolymer, cycloolefin polymer or other resin substrate having flexibility) can be used as the substrate 101. By using the resin substrate having flexibility, the display device can be bent. In addition, the material that transmits light is preferred as the substrate 101. In addition, the same substrate as the substrate 101 can be used for the opposing substrate 102.

In the display region 103 shown in FIG. 5, a plurality of pixels 109 are arranged in a matrix shape along directions (for example, x direction and y direction orthogonal to each other) which intersect each other. Each pixel 109 includes the pixel electrode, the light emitting element comprised from a part of the pixel electrode (anode), the organic layer (light emitting part) including the light emitting layer stacked above the pixel electrode, and the cathode, and the pixel circuit electrically connected to the pixel electrode. An image signal corresponding to image data is provide to each pixel circuit from a data line drive circuit via a signal line. In addition, a signal for selecting each pixel circuit is provided to each pixel circuit from a scanning line drive circuit via a scanning line. With these signals, it is possible to drive a transistor and perform screen display according to the image data. The signal line and the scanning line extend in directions intersecting each other. Furthermore, the groove part 230 or the groove part 240 explained in the previous embodiments is preferred to be provided in a region which overlaps with a signal line and a region overlapping with the scanning line.

Figure 6:
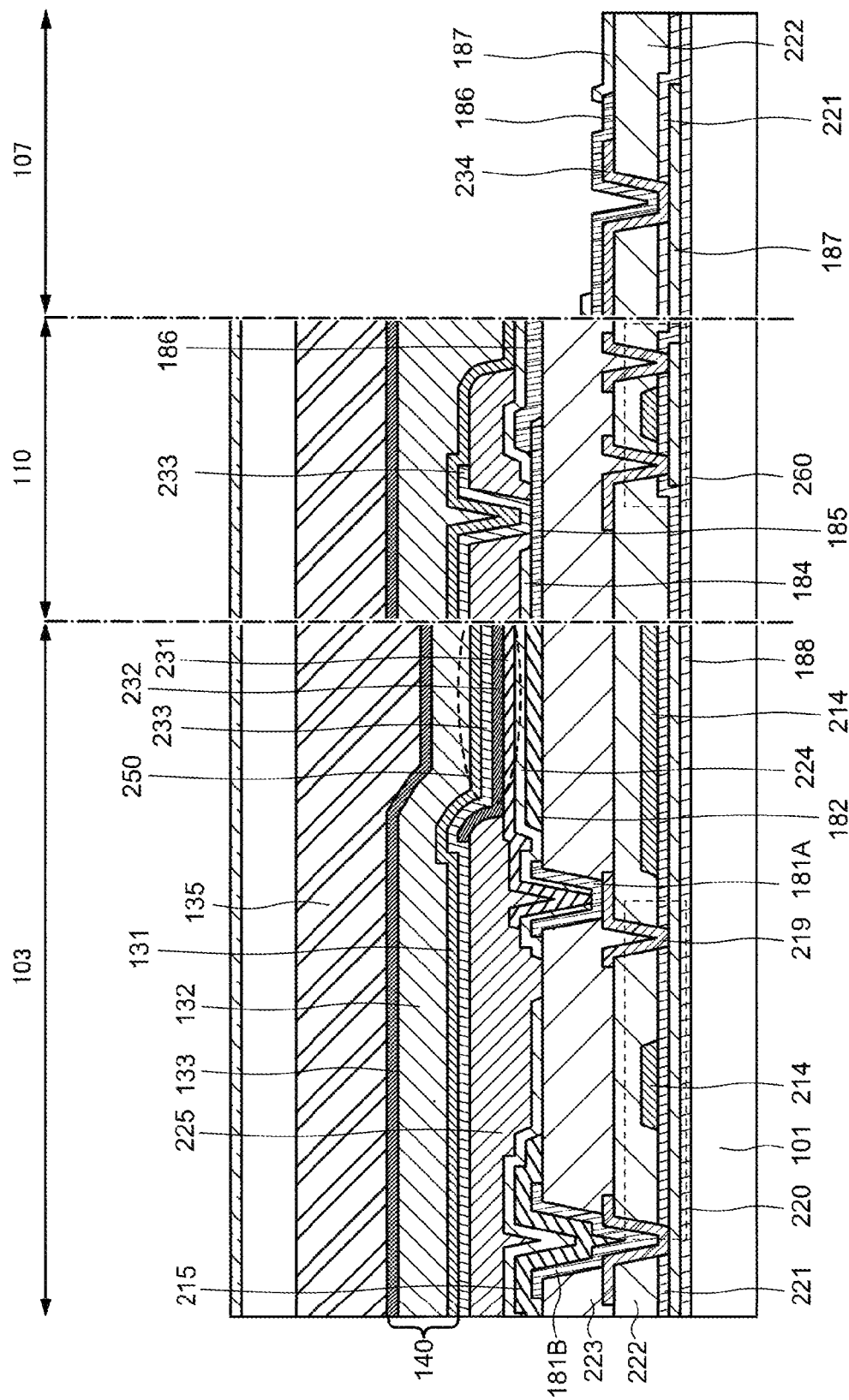
FIG. 6 is a cross-sectional view showing a structure of a display device related to an embodiment of the present invention.

FIG. 6 is a cross-sectional view of the display region 103, the periphery region 110 and the terminal 107 in the display device shown in FIG. 5 respectively.

In FIG. 6, a part of the pixel 109 is shown as the display region 103. The pixel 109 includes the transistor 220 and the light emitting element 250 electrically connected to the transistor 220. A thin film transistor (TFT) is shown as the transistor 220. However, the present invention is not limited to a thin film transistor and any element may be used as long as it has a current control function. In addition, the transistor 220 may be an n-channel transistor or a p-channel transistor.

In addition, as shown in FIG. 6, the transistor 220 may be connected to the pixel electrode 231 via a conductive layer 181A. In addition, an additional capacitance can be formed by arranging a conductive layer 182 above the planarization film 223, the insulating film 224 above the conductive layer 182, and the pixel electrode 231 above the insulating film 224. It is possible to form the conductive layer 182 in the same step as the wiring layer 215. Furthermore, by arranging the opening part in the planarization film 223 and arranging the conductive layer 181A and a conductive layer 181B in the opening part, the conductive layer 219 can be protected when the conductive layer 182 and the wiring layer 215 are formed.

A transistor 260 included in the scanning line driving circuit 104 and a so-called cathode contact are shown in the periphery region 110. Similar to the transistor 220, a thin film transistor can be used as the transistor 260. In addition, the transistor 260 may be an n-channel transistor or a p-channel transistor. In addition, the cathode contact refers to a region where the opposing electrode 233 and the conductive layer 185 are connected to each other. It is possible to form the conductive layer 185 in the same step as the conductive layers 181A and 181B. The conductive layer 185 may be further connected to a lower conductive layer.

A sealing film is arranged above the counter electrode 233 in the display region 103 and the periphery region 110.

It is preferred to arrange a sealing film 140 above the display region 103 and the periphery region 110. The sealing film 140 is arranged in order to prevent the entrance of moisture and oxygen. It is possible to form the sealing film 140 by combining an inorganic insulating material and an organic insulating material. FIG. 5 shows an example in which an inorganic insulating film 131, an organic insulating film 132 and an inorganic insulating film 133 are arranged as the sealing film 140. By arranging the sealing film above the display region 103, it is possible to prevent moisture and oxygen from entering the light emitting element 250.

For example, a film of silicon nitride (SixNy), silicon oxynitride (SiOxNy), silicon nitride oxide (SiNxOy), aluminum oxide (AlxOy), aluminum nitride (AlxNy), aluminum oxynitride (AlxOyNz) or aluminum nitride oxide (AlxNyOz) or the like can be used as the inorganic insulating film 131 and the inorganic insulating film 133 using a CVD method or a sputtering method (x, y, z are arbitrary). The thickness of the inorganic insulating film 131 is preferably 500 nm or more and 1000 nm or less and the thickness of the inorganic insulating film 133 is preferably 500 nm or more and 1000 nm or less. By arranging the inorganic insulating film 131 and the inorganic insulating film 133 with the thicknesses described above, it is possible to prevent moisture and oxygen from entering the light emitting element 250. For example, an acrylic resin, an epoxy resin, a polyimide resin, a silicone resin, a fluororesin, a siloxane resin, or the like can be used as the organic insulating film 132. The film thickness of the organic insulating film 132 is preferably 5 µm or more and 15 µm or less.

Furthermore, although the inorganic insulating film 131 and the inorganic insulating film 133 are each arranged with a region having a small thickness as explained in the previous embodiment, an illustration is omitted in FIG. 5.

A filler 135 is arranged above the inorganic insulating film 133. For example, an acrylic type, a rubber type, a silicone type, a urethane type adhesive material can be used as the filler 135. In addition, a spacer may be arranged in the filler 135 in order to secure a gap between the substrate 101 and the opposing substrate 102. This type of spacer may be mixed with the filler 135 or may be formed from a resin or the like above the substrate 101.

For example, an overcoat layer may be arranged for flattening in the opposing substrate 102. In the case when the organic layer 232 emits white light, the color filter corresponding to each color of RGB and a black matrix arranged between the color filters may be arranged on a main surface (surface facing the substrate 101) on the opposing substrate 102. In the case when the color filter is not formed on the counter substrate 102 side, for example, the color filter may be directly formed on the inorganic insulating film 133 and the filler 135 may be formed thereon. Furthermore, the organic insulating film 132 has a flattening effect and each layer above the organic insulating film 132 is formed flat. Therefore, the organic insulating film 132 is thick above the light emitting element 250 and thin above the insulating film 225.

In FIG. 6, terminals 107 is formed by the conductive layer 234 and a conductive layer 186. A semiconductor layer 187 is a film formed in the same step as the semiconductor layer 211 and the semiconductor layer 212. A conductive layer 234 is a film formed in the same step as the conductive layer 219. The conductive layer 186 is a film formed in the same step as the conductive layer 181. In addition, the semiconductor layer 187 may be left on a lower layer of the terminal 107.

In the display device shown in FIG. 6, an insulating film 188 is arranged as an underlying film above the substrate 101. Similar to the gate insulating film 221 and the interlayer insulating film 222, the insulating film 188 is formed of an inorganic insulating film including at least one of nitrogen and oxygen and silicon, and for example, it is possible to use silicon oxide or silicon nitride. The insulating film 188 improves an adhesion property to the substrate 101 and includes a blocking function of moisture and impurities from the outside. Since the inorganic insulating film is also used for the insulating film 188, similar to the gate insulating film 221 and the interlayer insulating film 222, a structure in which a groove part is arranged for each pixel or every plurality of pixels is arranged and the groove part is filled with the silicon-containing film is preferred.

Third Embodiment

Figure 7:
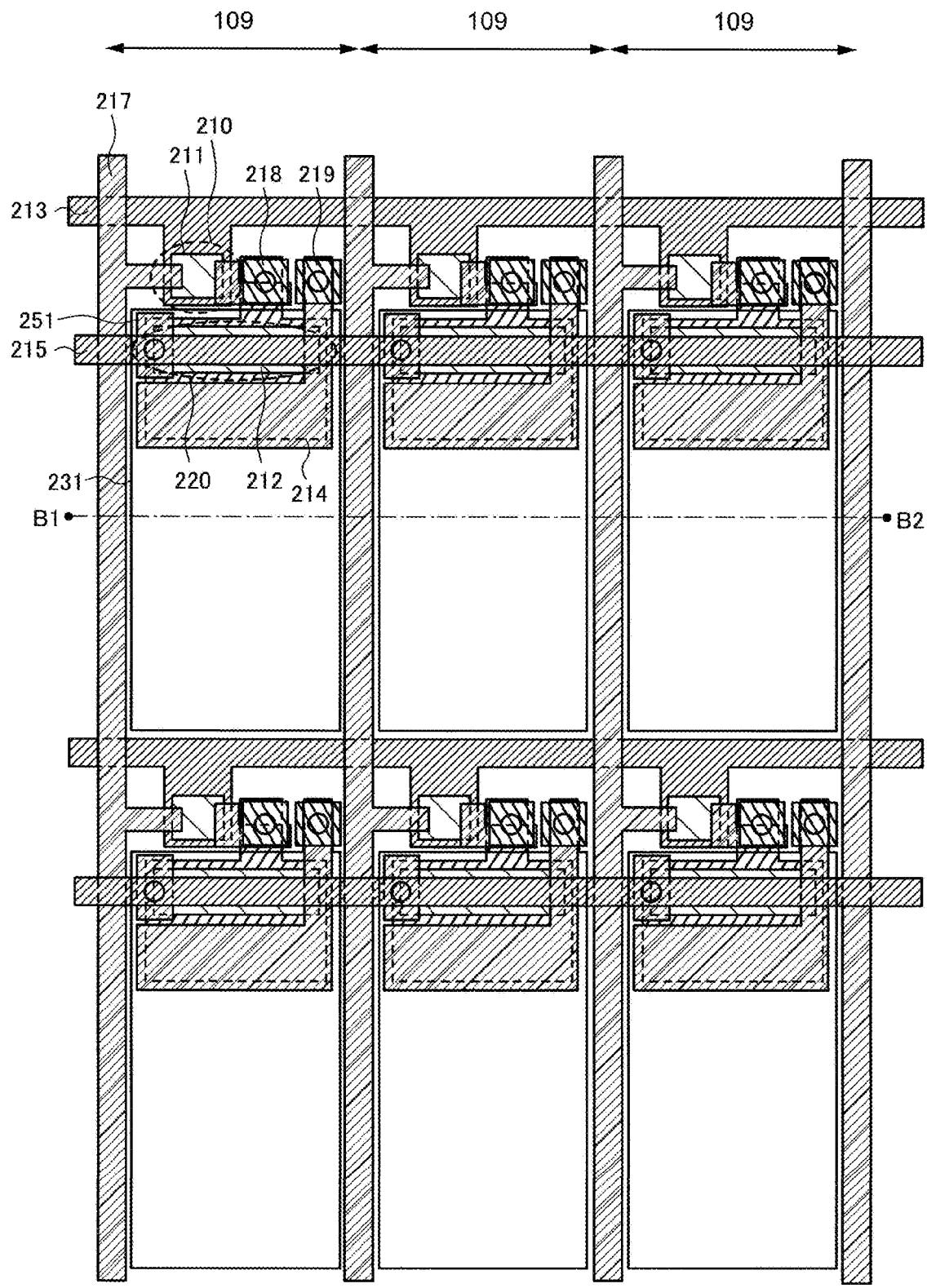
FIG. 7 is a planar view showing a pixel structure of a display device related to an embodiment of the present invention.
Figure 8:
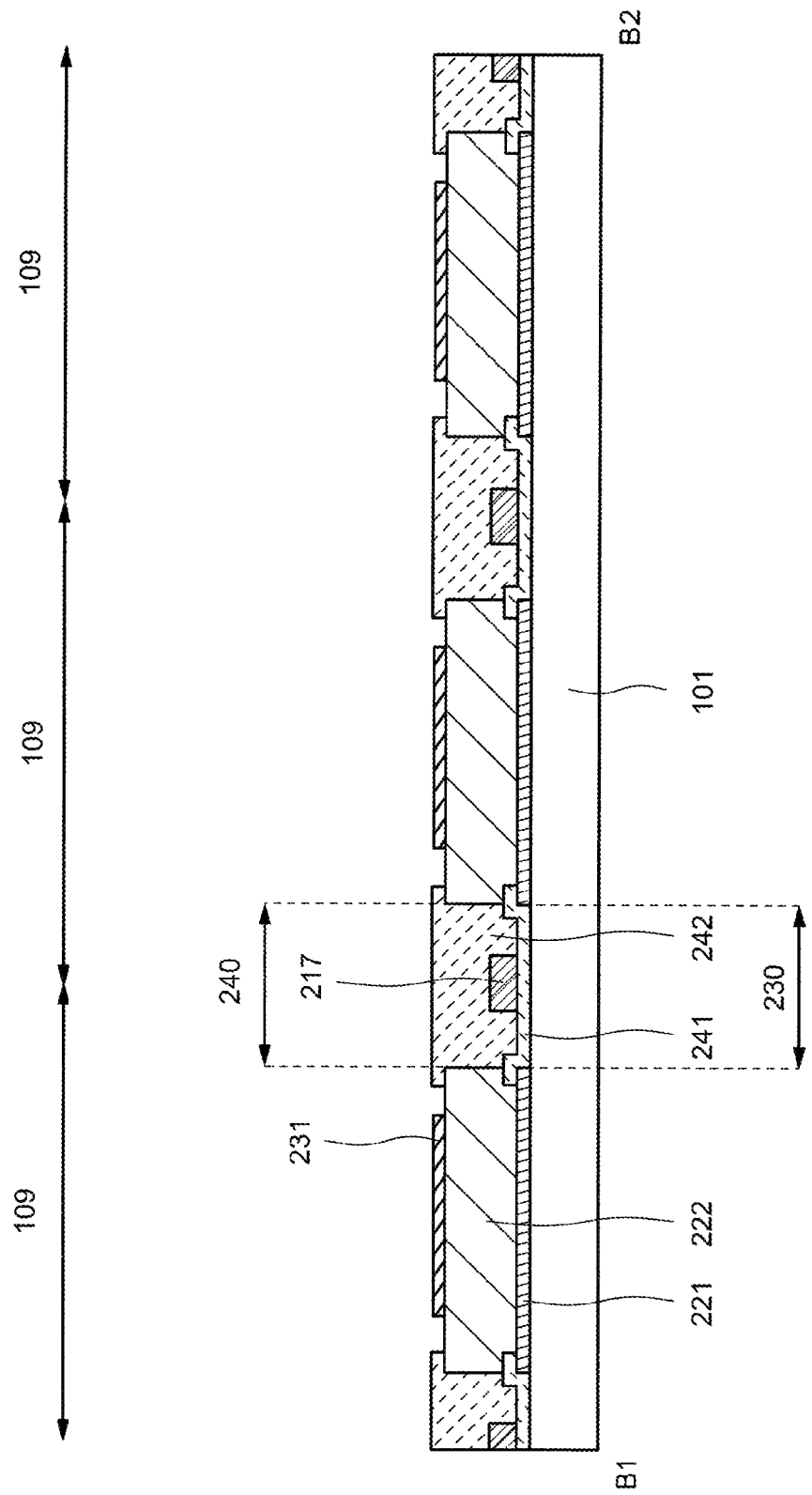
FIG. 8 is a cross-sectional view showing a pixel structure of a display device related to an embodiment of the present invention.
Figure 9:
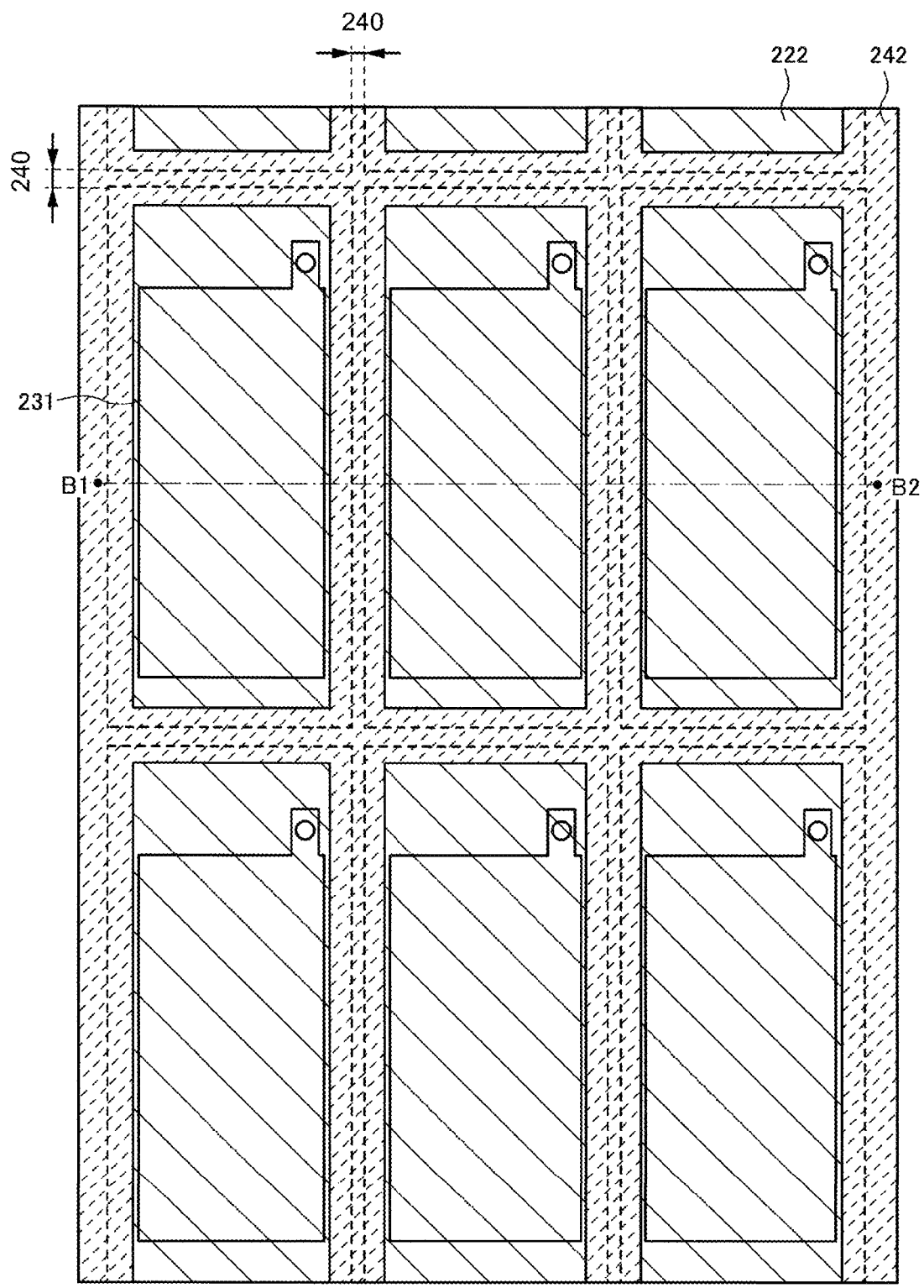
FIG. 9 is a planar view showing a pixel structure of a display device related to an embodiment of the present invention.

In the present embodiment, a different pixel layout from the pixel layout shown in the first embodiment is explained while referring to FIG. 7 to FIG. 9. In the third embodiment, a structure of a bottom-gate type transistor is illustrated. In the third embodiment, the same components as those of the first embodiment and the second embodiment are attached with the same reference numerals, and a detailed explanation thereof is omitted.

FIG. 7 shows 2 rows×3 columns of the pixels 109. In FIG. 7, a conductive layer and a semiconductor layer which form pixels 109 are shown, and the insulating film is omitted.

In FIG. 7, the wiring layer 213 is arranged in a first direction (x direction) of the display region 103, and the wiring layer 217 is arranged in a second direction (y direction) which intersects the first direction (x direction) of the display region 103. The semiconductor layer 211 is arranged above the wiring layer 213. On the other hand, the conductive layer 214 is arranged in the same layer as the wiring layer 213, and the semiconductor layer 212 is arranged above the conductive layer 214. A region where the wiring layer 213 and the semiconductor layer 211 overlap functions as the channel region of the transistor 210. A region where the conductive layer 214 and the semiconductor layer 212 overlap functions as the channel region of the transistor 220. In addition, the wiring layer 213 functions as a gate electrode and a gate line of the transistor 210, and the wiring layer 217 functions as a source electrode or a drain electrode and a signal line of the transistor 210. The conductive layer 214 functions as a gate electrode of the transistor 220, and the wiring layer 251 is connected to the wiring layer 215 and functions as a source electrode or a drain electrode of the transistor 220.

One of the source region and the drain region of the semiconductor layer 211 is connected to the wiring layer 217, and the other of the source region and the drain region is connected to the conductive layer 219. One of the source region and the drain region of the semiconductor layer 212 is connected to the wiring layer 251, and the other of the source region and the drain region is connected to the conductive layer 219. In addition, the conductive layer 219 is connected to the pixel electrode 231.

FIG. 8 is a cross-sectional view along the line B1-B2 of the pixel layout diagram shown in FIG. 7. FIG. 8 shows not only a conductive layer and a semiconductor layer but also an insulating film.

The gate insulating film 221 is arranged above the substrate 101. In the gate insulating film 221, the groove part 230 is arranged so as to divide each pixel 109. The silicon-containing film 241 is filled in the groove part 230.

The wiring layer 217 is arranged above the silicon-containing film 241. In addition, the interlayer insulating film 222 is arranged to cover a part of the silicon-containing film 241, the gate insulating film 221 and the wiring layer 217. The groove part 240 is arranged in the interlayer insulating film 222 in order to divide each pixel 109. In addition, the silicon-containing film 242 is filled in the groove part 240. The pixel electrode 231 is arranged above the interlayer insulating film 222. In addition, the groove part 230 and the groove part 240 are arranged to overlap each other.

FIG. 9 shows a diagram in which the interlayer insulating film 222 and the silicon-containing film 242 are added in the pixel layout diagram shown in FIG. 7.

The pixel electrode 231 is arranged above the interlayer insulating film 222. In addition, the pixel electrode 231 is connected to the conductive layer 219 through the contact hole of the interlayer insulating film 222. In addition, the pixel electrode 231 is arranged in a region surrounded by the groove part 240. In addition, although not shown in the diagram, the pixel electrode 231 may be arranged in a region surrounded by the groove part 230.

As shown in FIG. 7 to FIG. 9, the groove part 230 is arranged in the gate insulating film 221 so as to divide each pixel 109, and the groove part 240 is arranged in the interlayer insulating film 222 so as to divide each pixel 109. In this way, it is possible to suppress the occurrence of cracks in the gate insulating film 221 and the interlayer insulating film 222 even when the bending radius at the time of folding the display device is small. In addition, by filling the silicon-containing film with a substance having a softer property than the inorganic insulating film in the groove part 230 and the groove part 240, it is possible to alleviate the concentration of the stress at the time of bending the display device. In addition, since the silicon-containing film can suppress the entrance of moisture and oxygen more than the organic insulating film, it is possible to suppress the deterioration of a light emitting element. In this way, it is possible to improve the reliability of the display device.

Based on the display device explained as embodiments and examples according to the present invention, a person skilled in the art could appropriately add, delete or change design elements, or add, omit or change conditions of the process and such changes are also included in the scope of the present invention as long as they have the gist of the present invention. In addition, each of the embodiments described above can be combined with each other within a range which does not produce a technical contradiction.

In addition, other actions and effects different from the actions and effects brought about by the modes of the embodiments described above, those that are obvious from the description of this specification, or those which can be easily predicted by a person skilled in the art are to be interpreted as obviously being provided by the present invention.

What is claimed is:

1. A display device comprising:
    a substrate having flexibility;
    a first inorganic insulating film including silicon and at least one of nitrogen and oxygen arranged above the substrate;
    a first groove part arranged so as to divide the first inorganic insulating film;
    a first film filled into the first groove part; and
    a pixel electrode arranged to overlap a region surrounded by the first groove part,
    wherein
    the first film includes polysiloxane or polysilazane.

2. The display device according to claim 1, further comprising:
    a bank covering an end part of the pixel electrode and including an opening part exposing a part of an upper surface of the pixel electrode;
    an organic layer including a light emitting layer arranged so as to cover the opening part; and
    an opposing electrode arranged so as to cover a part of the organic layer and the bank.

3. The display device according to claim 2, wherein the opening part does not overlap the first groove part in a planar view.

4. The display device according to claim 1, wherein each of end parts of the first film overlaps with the first inorganic insulating film.

5. The display device according to claim 1, further comprising:
    a pixel circuit electrically connected with the pixel electrode;
    a signal line inputting an image signal to the pixel circuit; and
    a scanning line selecting a pixel circuit input with the image signal,
    wherein
    the signal line and the scanning line extend in mutually intersecting directions, and the first groove part is arranged in a region overlapping the signal line and a region overlapping the scanning line.

6. The display device according to claim 5, further comprising:
    a second inorganic insulating film including silicon and at least one of nitrogen and oxygen arranged so as to cover the first inorganic insulating layer and a part of the first film;
    a second groove part dividing the second inorganic insulating film arranged in a region overlapping the first film; and
    a second film filled into the second groove part,
    wherein
    the second film includes polysiloxane or polysilazane.

7. The display device according to claim 6, wherein each of end parts of the second film overlaps with the second inorganic insulating film.

8. The display device according to claim 6, wherein the first groove part and the second groove part overlap in a planar view.

9. The display device according to claim 6, wherein the amount of oxygen in the first film is different to the amount of oxygen in the second film.

10. The display device according to claim 6, wherein the amount of oxygen included in the first film is different to the amount of oxygen included in the second film.

* * * * *